(12) United States Patent
Adkisson et al.

(10) Patent No.: US 8,743,247 B2
(45) Date of Patent: *Jun. 3, 2014

(54) LOW LAG TRANSFER GATE DEVICE

(75) Inventors: James W. Adkisson, Jericho, VT (US);
Andres Bryant, Burlington, VT (US);
John J. Ellis-Monaghan, Grand Isle, VT (US)

(73) Assignee: International Business Machines Corporation, Armonk, NY (US)

( * ) Notice: Subject to any disclaimer, the term of this patent is extended or adjusted under 35 U.S.C. 154(b) by 1236 days.

This patent is subject to a terminal disclaimer.

(21) Appl. No.: 12/013,826

(22) Filed: Jan. 14, 2008

(65) Prior Publication Data

US 2009/0180010 A1  Jul. 16, 2009

(51) Int. Cl.
  *H04N 3/14* (2006.01)
  *H01L 31/062* (2012.01)
(52) U.S. Cl.
  USPC .......................... 348/294; 257/292
(58) Field of Classification Search
  USPC ........... 348/308, 294, 295, 297, 314, 38, 299, 348/298; 257/291, 292, 308, 294, 295, 297, 257/314, 299, 298, 272
  See application file for complete search history.

(56) References Cited

U.S. PATENT DOCUMENTS

| | | |
|---|---|---|
| 6,352,869 B1 | 3/2002 | Guidash |
| 6,433,373 B1 | 8/2002 | Lee et al. |
| 6,714,239 B2 | 3/2004 | Guidash |
| 6,908,839 B2 | 6/2005 | Rhodes |
| 7,675,097 B2 * | 3/2010 | Adkisson et al. ............. 257/292 |
| 7,791,116 B1 * | 9/2010 | Rhodes .......................... 257/292 |
| 7,888,715 B2 * | 2/2011 | Ahn et al. ....................... 257/292 |
| 2004/0092054 A1 | 5/2004 | Mouli et al. |

(Continued)

OTHER PUBLICATIONS

Notice of Allowance dated Mar. 13, 2012 received in a related U.S. Appl. No. 12/013,817.

(Continued)

*Primary Examiner* — Ahmed A Berhan
(74) *Attorney, Agent, or Firm* — Scully, Scott, Murphy & Presser, P.C.; Anthony J. Canale

(57) ABSTRACT

A method of forming a CMOS active pixel sensor (APS) cell structure having at least one transfer gate device and method of operation. A first transfer gate device comprises a diodic or split transfer gate conductor structure having a first doped region of first conductivity type material and a second doped region of a second conductivity type material. A photosensing device is formed adjacent the first doped region for collecting charge carriers in response to light incident thereto, and, a diffusion region of a second conductivity type material is formed at or below the substrate surface adjacent the second doped region of the transfer gate device for receiving charges transferred from the photosensing device while preventing spillback of charges to the photosensing device upon timed voltage bias to the diodic or split transfer gate conductor structure. Alternately, an intermediate charge storage device and second transfer gate device may be provided which may first temporarily receive charge carriers from the photosensing device, and, upon activating the second transfer gate device in a further timed fashion, read out the charge stored at the intermediate charge storage device for transfer to the second transfer gate device while preventing spillback of charges to the photosensing device. The APS cell structure is further adapted for a global shutter mode of operation, and further comprises a light shield element is further provided to ensure no light reaches the photosensing and charge storage devices during charge transfer operation.

10 Claims, 19 Drawing Sheets

(56) References Cited

U.S. PATENT DOCUMENTS

| | | |
|---|---|---|
| 2004/0217436 A1 | 11/2004 | Kimura |
| 2005/0012836 A1 | 1/2005 | Guidash |
| 2006/0006437 A1 | 1/2006 | Song et al. |
| 2006/0060897 A1 | 3/2006 | Kuwazawa |
| 2006/0084195 A1 | 4/2006 | Lyu |
| 2006/0138581 A1* | 6/2006 | Ladd .............................. 257/462 |
| 2006/0141661 A1 | 6/2006 | Park et al. |
| 2006/0249764 A1* | 11/2006 | Huang et al. .................. 257/291 |
| 2006/0256221 A1 | 11/2006 | McKee et al. |

OTHER PUBLICATIONS

Office Action dated Jul. 25, 2011 received in related case, namely, U.S. Appl. No. 12/013,817.

* cited by examiner

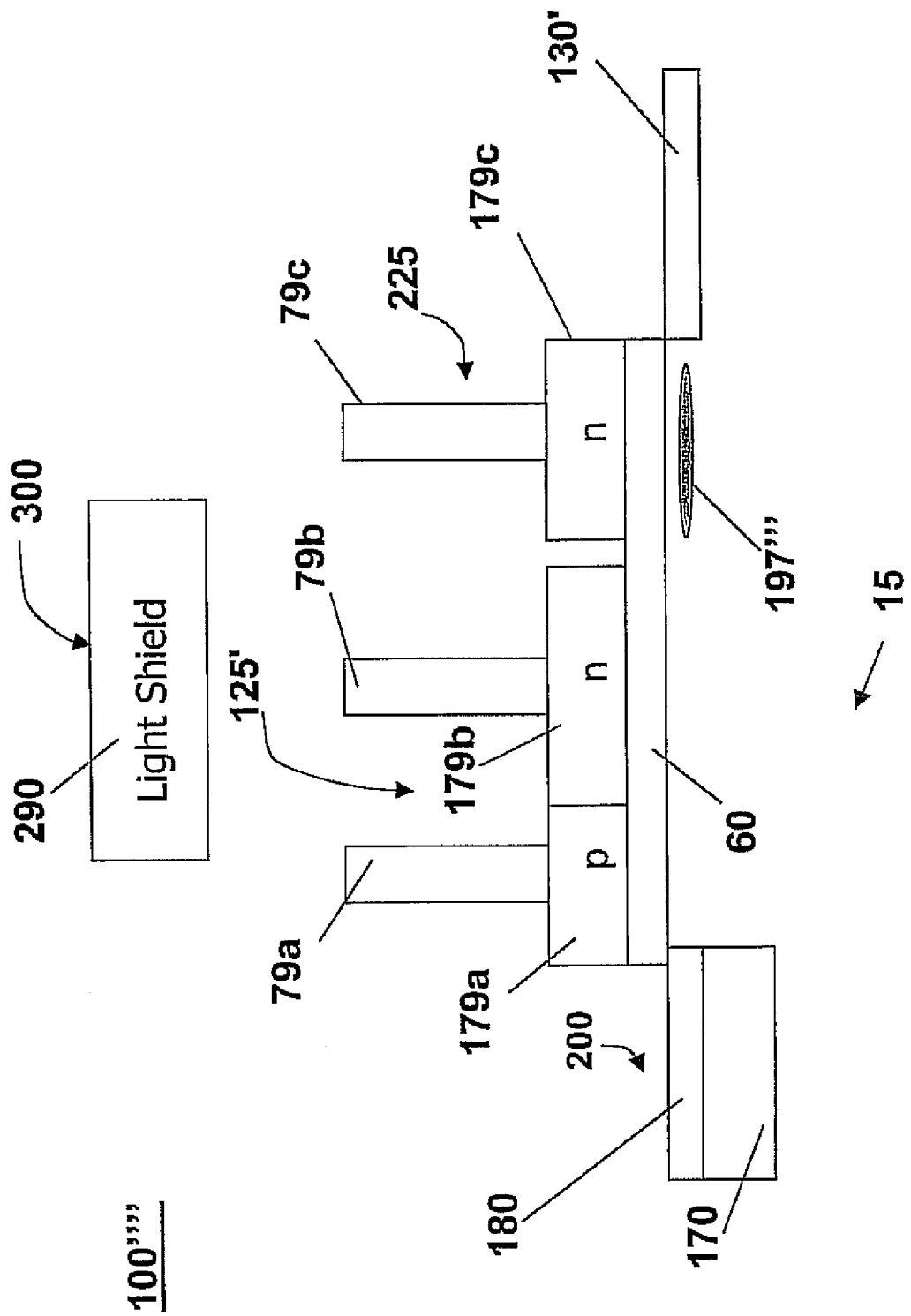

LOW LAG TRANSFER GATE DEVICE

CROSS-REFERENCE TO RELATED APPLICATION

This application is related to a concurrently filed U.S. patent application Ser. No. 12/013,817.

FIELD OF THE INVENTION

The present invention relates to semiconductor optical image sensors, and particularly, to a novel CMOS (complementary metal oxide semiconductor) image sensor cell structure including a transfer gate device exhibiting reduced lag, higher capacity and lower dark current.

DESCRIPTION OF THE PRIOR ART

CMOS image sensors are now replacing conventional CCD sensors for applications requiring image pick-up such as digital cameras, mobile telephones, cellular telephones, pervasive digital devices such as PDA's (personal digital assistant), personal computers, medical devices, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

Current CMOS image sensors comprise an array of CMOS Active Pixel Sensor (APS) cells, which are used to collect light energy and convert it into readable electrical signals. Each APS cell comprises a photosensitive element, such as a photodiode, photogate, or photoconductor overlying a doped region of a substrate for accumulating photo-generated charge in an underlying portion thereof. A read-out circuit is connected to each pixel cell and often includes a diffusion region for receiving charge from the photosensitive element, when read-out. Typically, this is accomplished by a transistor device having a gate electrically connected to the floating diffusion region. The imager may also include a transistor, having a transfer gate, for transferring charge from the photosensitive element across a channel to the floating diffusion region, and a transistor for resetting the floating diffusion region to a predetermined charge level prior to charge transfer.

As shown in FIG. 1, a typical CMOS APS cell 10 includes a pinned photodiode 20 having a top pinning layer 18 doped p-type and, an underlying lightly doped n-type collection well region of layer 17 formed on the p-type substrate. Typically, the pinned diode 20 is formed on top of a p-type substrate 15 or a p-type epitaxial layer or p-well surface layer having a lower p-type concentration than the diode pinning layer 18. As known, the surface doped p-type pinning layer 18 is in electrical contact with the substrate 15 (or p-type epitaxial layer or p-well surface layer). The photodiode 20 thus has two p-type regions 18 and 15 having a same potential so that the n-type doped region 17 is fully depleted at a pinning voltage (Vp). The pinned photodiode is termed "pinned" because the potential in the photodiode is pinned to a constant value, Vp, when the photodiode is fully depleted.

As further shown in FIG. 1, the n-type doped region 17 and p region 18 of the photodiode 20 are spaced between an isolation region, e.g., a shallow trench isolation (STI) region 40, and a charge transfer transistor gate 25 which is surrounded by thin spacer structures 23a,b. The shallow trench isolation (STI) region 40 may be located proximate the pixel image cell for isolating the cell from an adjacent pixel cell. It is understood however, that some manufacturers make pixels without STI, or only in some specific locations. In operation, light received at the pixel is focused down onto the photodiode where electrons collect at the n-type region 17. When the transfer gate device 25 is operated, i.e., turned on by applying a voltage to the transfer gate 70 comprising, for example, an n-type doped polysilicon layer 70 over a thin dielectric layer 60, the photo-generated charge 24 is transferred from the charge accumulating doped n-type doped region 17 via a transfer device channel 16 to a floating diffusion region 30, e.g., a floating "node" doped n+type. It is understood that suitable readout circuitry is electrically connected with the floating diffusion region for reading out a signal representing the amount of charges transferred to the floating diffusion region.

For example, FIG. 2 depicts a further prior art CMOS APS cell 10 having incorporated a gate 25' having a portion that is p-type material 70a and a portion that is n-type 70b. The n-type portion 70b of the gate has a lower Vt and the p-type portion 70a of the gate has a higher Vt. By having both present in the gate at the same time, the transfer gate has a built in field pulling electrons from the photodiode to the floating diffusion. Additionally, in the design of the CMOS APS cell 10' it has been noticed that the presence of silicide contact regions (not shown) formed over the floating node diffusions, in the array, causes a bright point defect leakage problem. That is, due to the additional presence of formed silicide contacts over these diffusions, it has been found that occasional pixels see silicide "spikes" which leak current at levels high enough to make that pixel unusable. As a result, silicide has been removed from the arrays of CMOS imagers for bright point yield.

It is understood that the prior art contemplates a CMOS imager having a silicide layer blocked from the photodiode surface since silicide blocks light while a silicide layer formed over the transfer gate polysilicon and floating diffusion remain. Furthermore, silicide layers may be removed from the gate poly and floating diffusion for even lower leakage behavior.

The APS cell configuration described herein with respect to FIGS. 1 and 2 that includes a pinned photodiode improves the device performance by decreasing dark current (current output by a pixel in a dark environment). However, the pinned photodiode configuration may cause image lag due to the incomplete transfer of charge from the photodiode to the floating node.

That is, it is currently difficult to get low lag when pulling charge from a source/drain combination that is not essentially assymmetric. This is because it is difficult to extract charges from a photodiode without some of the charges "spilling back" into the photodiode when the transfer gate is turned off. Thus, there is needed a way to avoid having the accumulated charge just distribute between the two diffusions.

In a current configuration, Vt gradation may be used across the transfer gate to create a built in field that funnels carriers from photodiode to the floating diffusion area. This may be performed by doping the channel differently on source and drain sides, or, by doping the transfer gate differently on the source and drain sides. However, with both the source/drain and the poly doping approaches, there is a trade off between "spillback" lag and photodiode reset-ability. That is, when the Vt is high at the photodiode side of the transfer gate. Spill back goes away, but it is hard to extract all the carriers out of the photodiode due to the high barrier. When the Vt is low at the photodiode side, all the carriers are removed out of the photodiode under the transfer gate. But then they redistribute back into the photodiode when the gate is turned off.

Unfortunately, however, with the absence of the silicide from imagers with a transfer gate having n and p regions, each CMOS APS cell gate polysilicon formed with the built-in diode within the gate prevents the entire gate from being contacted. That is, a contact which only connects either the n-type or p-type side of the polysilicon gate will not be adequately connected to the other polarity of the gate poly layer. This results in a time dependent voltage on the uncontacted portion of the gate. That is, if a contact is made to the n-type part of the gate, the p-type part floats; likewise, if contact is made to the p-type side of the gate, the n-type part floats. If a contact is formed directly over the boundary edge, contact overlay allows it to contact only one side statistically.

U.S. Patent Publication No. US2004/0262651 is another example of a transfer gate having with multiple workfunctions on a gate. For example, the gate comprises at least one gate region having a work-function greater than a work-function of n+ polysilicon.

U.S. Patent Publication No. 2006/0138581 teaches a photosensor device having a split transfer gate with an isolation region formed therebetween. In this disclosure, a first part of the transfer gate is connected to a first voltage source and a second part of the transfer gate is connected to a second voltage source. The voltages applied to the two portions of the transfer gate are oppositely biased to decrease dark current while controlling blooming of electrons within and out of the pixel cell.

While a FET transistor device having a gate in the form of a diode is known in the art, there is currently no such teaching of a photocell structure having a diodic transfer gate having anode and cathode regions that are both contacted separately or biased differently and, switched and biased in a timed manner to address the "spillback" lag and photodiode resetability aspects of the image sensor device.

It would thus be highly desirable to provide a CMOS image sensor array including a novel APS cell structure that includes a transfer FET gate having a diodic or split gate structure that may be separately biased to exhibit reduced (low) lag and dark current leakage phenomena, and particularly, one that provides the ability to apply two different potentials to clock the charges out of the photodiode without allowing them to "spill-back".

SUMMARY OF THE INVENTION

The invention relates generally to improved semiconductor imaging devices and in particular to a method of forming a novel CMOS active pixel sensor (APS) cell structure for an imaging device using a standard CMOS manufacturing processes.

The CMOS active pixel sensor (APS) cell structure has a transfer gate device comprising a gate dielectric layer formed on a substrate and a gate conductor layer formed on the gate dielectric layer, the gate conductor layer having a first doped region of first conductivity type material and a second doped region of a second conductivity type material. A photosensing device is formed at or below a substrate surface adjacent the first doped region of the transfer gate device for collecting charge carriers in response to light incident thereto, and, a diffusion region of a second conductivity type material is formed at or below the substrate surface adjacent the second doped region of the transfer gate device. The transfer gate device forms a channel region enabling charge transfer between the photosensing device and the diffusion region. After performing charge carrier collection at the photosensing device, a two-phase voltage bias is applied to the first and second transfer gate electrodes for forcing collected charge carriers from the photsensing device to the diffusion region while preventing spillback of charges to the photosensing device.

In one embodiment, the transfer gate comprises a single physical gate structure with n and p type doped regions to form a diode. The n and p regions are then contacted separately such that the structure acts as a diodic transfer gate.

Further to this embodiment, two substantially equal potentials may be applied to clock the charges out of the photodiode without allowing it to "spill-back" into the photodetecting region.

In an alternate embodiment, the transfer gate comprises a plurality of distinct gate structures, e.g. one n-type gate and one p-type gate, separated by a small distance. This "split" transfer gate can additionally be used to transfer charge from the photodiode to the floating diffusion also while preventing "spill back" of charge back into the photodetecting region.

Thus, according to one aspect of the invention, there is provided a method of forming an active pixel sensor (APS) cell structure comprising the steps of:

providing a substrate of a first conductivity type material;

forming a gate dielectric layer on the substrate;

forming a gate conductor structure on the gate dielectric layer, the gate conductor layer comprising a first doped region of first conductivity type material including an associated first transfer gate electrode and a second doped region of a second conductivity type material including an associated second transfer gate electrode;

forming a photosensing device formed at or below a substrate surface adjacent the first doped region of the gate conductor structure for collecting charge carriers in response to light incident thereto; and, forming a diffusion region of a second conductivity type material at or below the substrate surface adjacent the second doped region of the gate conductor structure, the gate conductor structure defining a channel region in the substrate for enabling charge transfer between the photosensing device and the diffusion region, and, the first and second transfer gate electrodes for receiving signals timed for transferring collected charge carriers from the photsensing device to the diffusion region while preventing spillback of charges to the photosensing device.

Further to this aspect of the invention, in one embodiment, the gate conductor structure comprises a diode.

Further to this aspect of the invention, in one embodiment, the first doped region of first conductivity type material and the second doped region of a second conductivity type material of the gate conductor structure are separated by a distance from each other.

Further to this aspect of the invention, in one embodiment, after performing charge carrier collection in response to light incident at the photosensing device, a two-phase voltage bias is applied to respective first and second transfer gate electrodes for forcing collected charge carriers from the photsensing device to the diffusion region while preventing spillback of charges to the photosensing device.

In a further aspect of the invention, in one embodiment, the gate conductor structure is a first gate conductive structure and the diffusion region of a second conductivity type material is replaced with a structure comprising:

a charge storage device formed adjacent the first gate conductor structure at or below a substrate surface for storing charge carriers transferred from the photosensing device;

a light shield element for preventing incident light from reaching the charge storage device in accordance with a global shutter mode of operation;

a second gate conductor structure formed on a gate dielectric layer, the second gate conductor structure comprising a second doped region of second conductivity type material including an associated second transfer gate electrode; and, a second doped diffusion region formed at or below the substrate surface adjacent the second gate conductor structure for receiving charge carriers collected from the charge storage device as transferred from the photosensing device, the second gate conductor structure receiving a timed signal for forming a channel region enabling charge transfer between the charge storage device and the second doped diffusion region, wherein the light shield element prevents incident light from reaching the charge storage device.

Further to this aspect of the invention, in one embodiment, the transfer gate device comprises a single physical gate structure with n and p type doped regions to form a diode. The n and p regions are then contacted separately such that the structure acts as a diodic transfer gate.

According to a further aspect of the invention, there is provided a method of operating an active pixel sensor (APS) cell structure comprising:

providing an active pixel sensor (APS) cell structure comprising:

a substrate of a first conductivity type material;
a gate dielectric layer formed on the substrate;
a gate conductor structure formed on the gate dielectric layer, the gate conductor layer comprising a first doped region of first conductivity type material including an associated first transfer gate electrode and a second doped region of a second conductivity type material including an associated second transfer gate electrode;

a photosensing device formed at or below a substrate surface adjacent the first doped region of the gate conductor structure for collecting charge carriers in response to light incident thereto; and, a diffusion region of a second conductivity type material formed at or below the substrate surface adjacent the second doped region of the gate conductor structure, the gate conductor layer defining a channel region in the substrate enabling charge transfer between the photosensing device and the diffusion region, and, wherein subsequent to performing charge carrier collection in response to light incident at the photosensing device, applying signals to the first and second transfer gate electrodes timed for transferring collected charge carriers from the photsensing device to the diffusion region while preventing spillback of charges to the photosensing device.

Further to this aspect of the invention, in one embodiment, the gate conductor structure comprises a diode.

Further to this aspect of the invention, in one embodiment, the first doped region of first conductivity type material and the second doped region of a second conductivity type material are separated by a distance, the method of operating an active pixel sensor (APS) cell structure including applying the signals to the first and second transfer gate electrodes in timed succession for preventing said spillback of charges.

Advantageously, the teachings of the invention may be applicable for devices of both polarities, i.e., n type photodiodes and p type pinning layers and nFETS, as well as to p type photodiodes, and n type pinning layers with pFETs.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF PREFERRED EMBODIMENTS

Prior to describing the present invention in detail, it is instructive to note that the present invention is preferably used in, but not limited to, a CMOS active pixel sensor. Active pixel sensor (APS) refers to an active electrical element within the pixel, other than transistors functioning as switches. For example, the floating diffusion or amplifier are active elements. CMOS refers to complementary metal oxide silicon type electrical components such as transistors which are associated with the pixel, but typically not in the pixel, and which are formed when the source/drain of a transistor is of one dopant type and its mated transistor is of the opposite dopant type. CMOS devices include some advantages one of which is it consumes less power.

Figure 1:
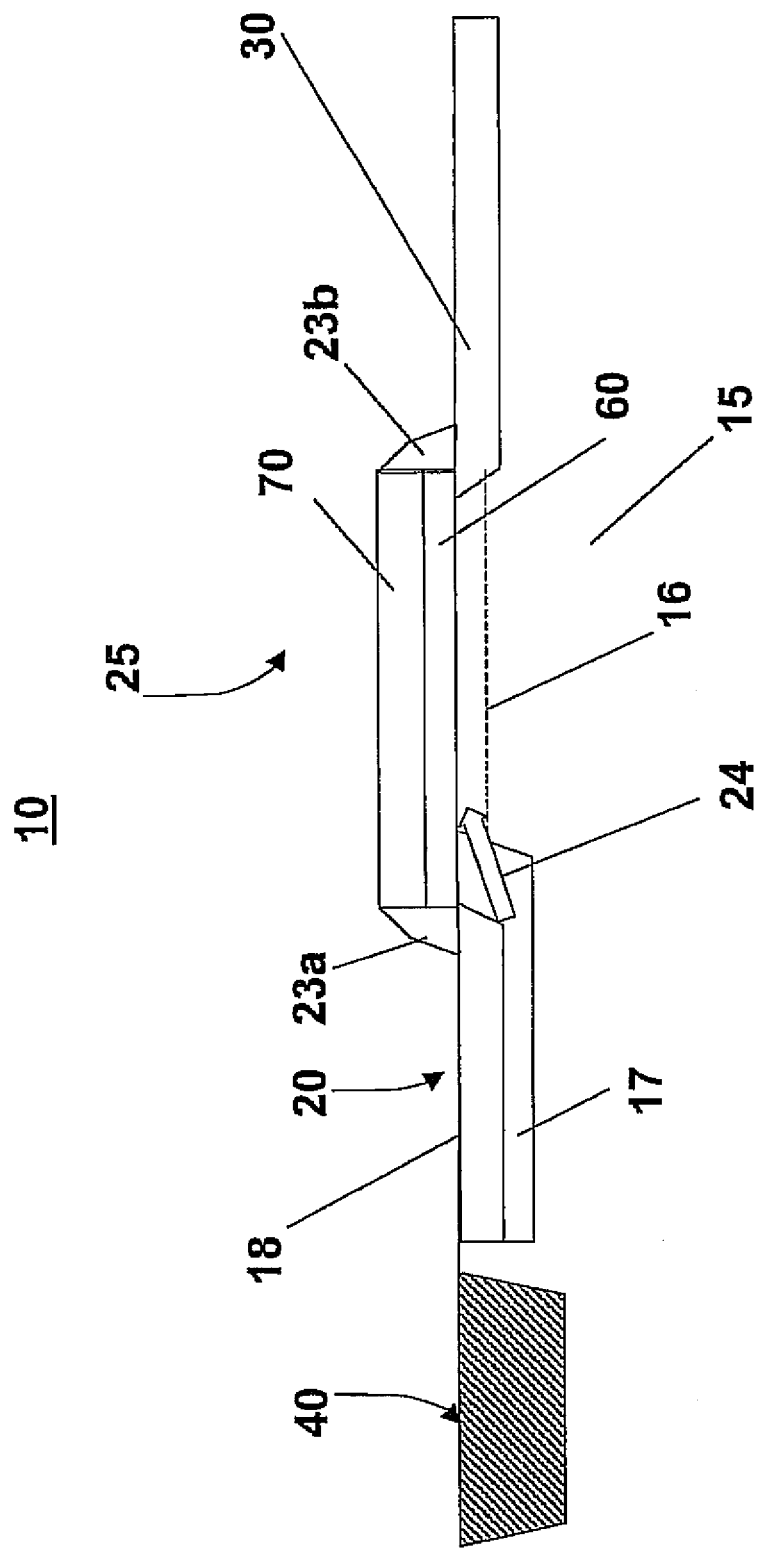
FIG. 1 depicts a CMOS Active Pixel Sensor (APS) cell 10 for an image sensor according to the prior art.
Figure 2:
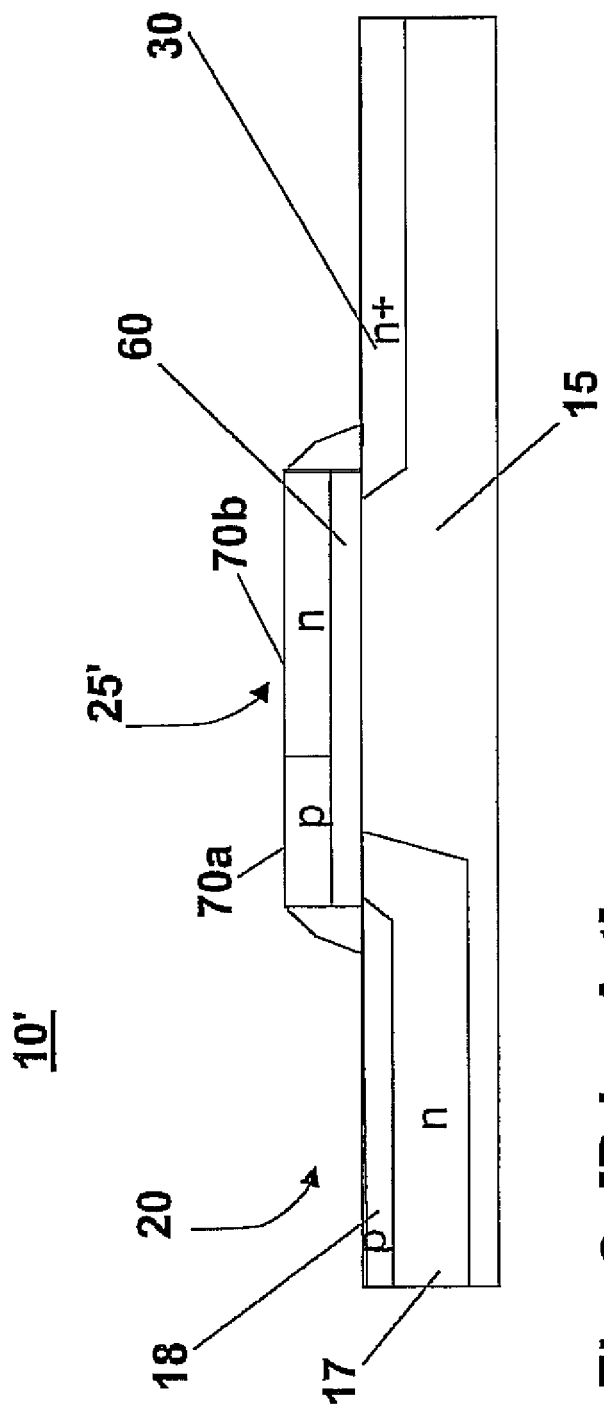
FIG. 2 illustrates, through a cross-sectional view, a CMOS Active Pixel Sensor (APS) cell 10' according to the prior art having a gate polysilicon layer with a built in diode, e.g., a pn junction.
Figure 3:
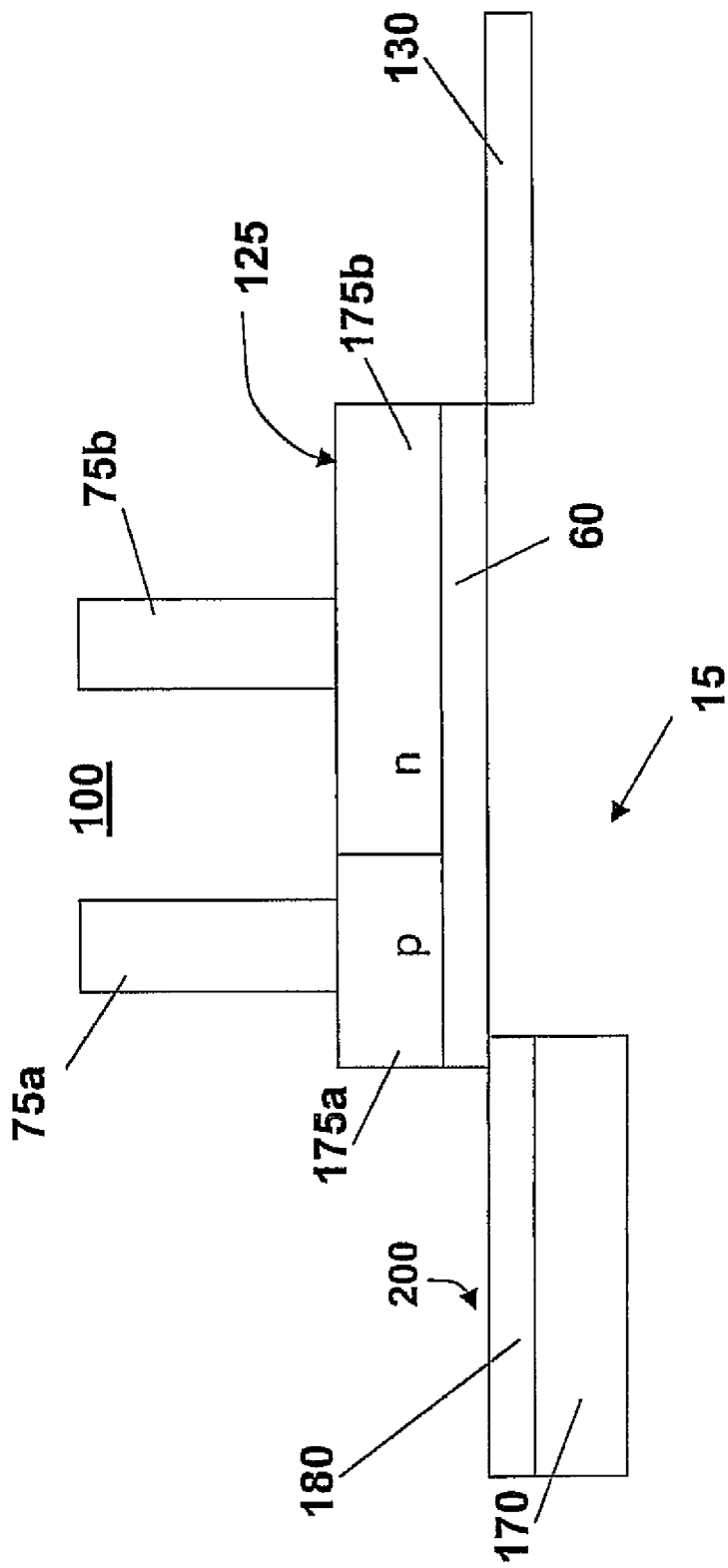
FIG. 3 illustrates, through a cross-sectional view, a CMOS APS cell 100 having silicide contacts regions removed from the photodiode and floating node diffusion regions and, having separate gate contact conductors formed on respective anode and cathode of the diodic transfer gate according to a first embodiment of the invention.

Co-pending U.S. patent application Ser. No. 11/565,801 entitled "SILICIDE STRAPPING IN IMAGER TRANSFER GATE DEVICE" describes a CMOS active pixel sensor (APS) cell structure having dual workfunction transfer gate device and method of fabrication. The transfer gate device comprises a dielectric layer formed on a substrate and a dual workfunction gate conductor layer formed on the dielectric layer comprising a first conductivity type doped region and an abutting second conductivity type doped region. The transfer gate device defines a channel region where charge accumulated by a photosensing device is transferred to a diffusion region. The disclosed APS cell structure includes a silicide structure formed atop the dual workfunction gate conductor layer for electrically coupling the first and second conductivity type doped regions for improved gate barrier ac characteristics. FIG. 3 illustrates, through a cross-sectional view, a CMOS imager APS 100 including photosensing device, e.g., photodiode 200 formed at one side of a silicon-containing, e.g., polysilicon, transfer gate 125 according to a first embodiment of the invention, and, an n-type floating diffusion region 130 at the other side of the transfer gate 125. The polysilicon transfer gate 125 is a diode including an anodic (p-type doped) region 175a and abutting cathodic (n-type doped) region 175b. In one non-limiting example, the polysilicon transfer gate 125 comprises a Schottky diode. Further formed on each respective anodic (p-type doped) region 175a and abutting cathodic (n-type doped) region 175b are respective gate contacts 75a, 75b.

Figure 4:
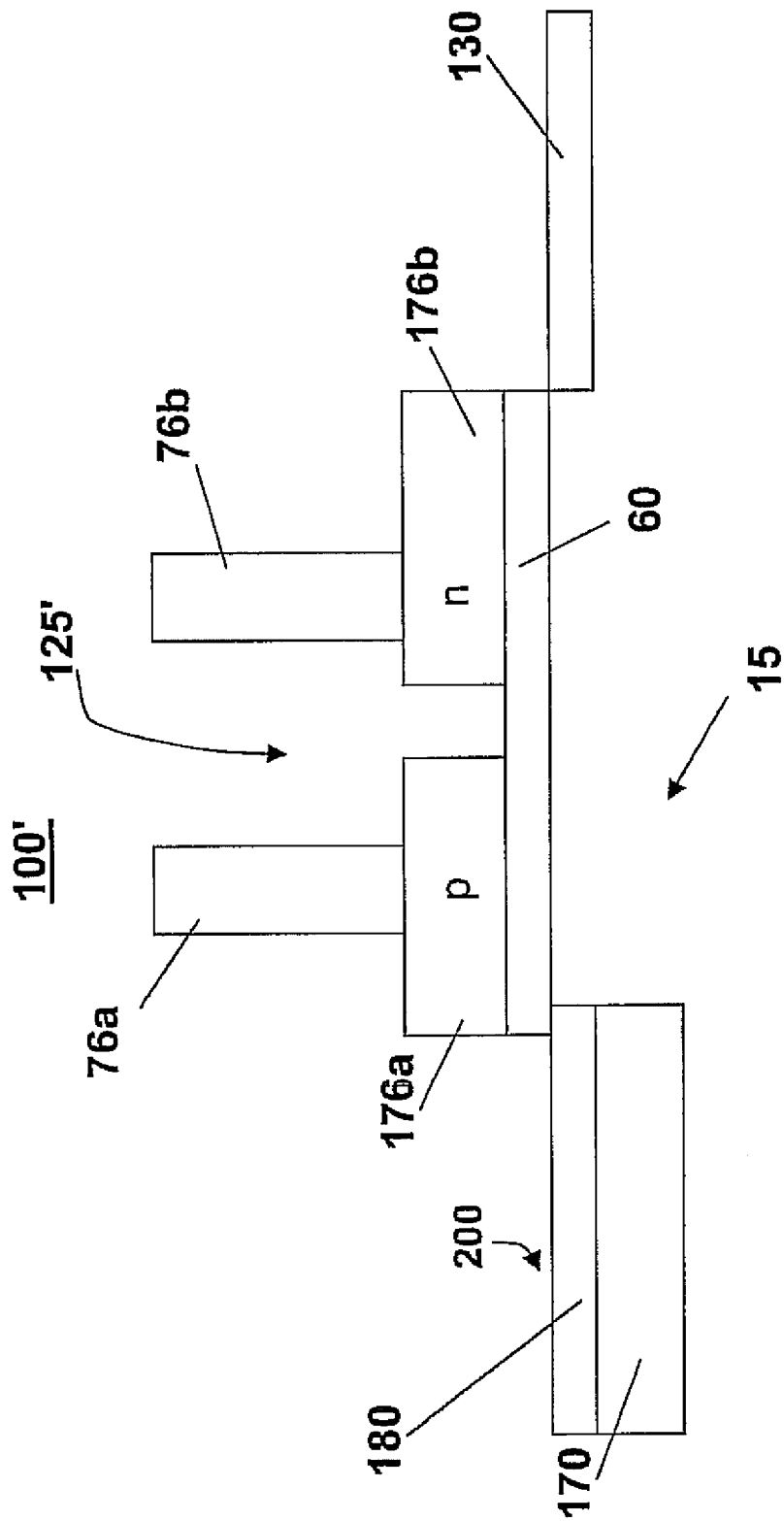
FIG. 4 illustrates, through a cross-sectional view, a CMOS APS cell 100' having two distinct transfer gate structures, spaced apart, each doped of opposite conductivity, and, having separate transfer gate contact conductors formed on each respective gate structure according to a second embodiment of the invention.

In an alternate embodiment of the invention, instead of a diodic transfer gate structure, the transfer gate comprises two distinct gate structures separated by a small distance with each gate structure doped with opposite conductivity type. More specifically, FIG. 4 illustrates, through a cross-sectional view, a back end of line CMOS imager APS 100' including photosensing device, e.g., photodiode 200 formed at one side of a silicon-containing, e.g., polysilicon, transfer gate device 125' according to a second embodiment of the invention, and, an n-type floating diffusion region 130 at the other side of the transfer gate 125'. The polysilicon transfer gate 125' includes a first p-type doped gate structure 176a and a second n-type doped gate structure 176b separated a small distance which, in one embodiment, may be 200 nm or less, e.g., about 100 nm, although, it is understood that there is no minimum spacing, just minimum resolvable image sizes. Each of the doped gate structures are formed over the thin dielectric layer 60. Formed on each respective first p-type doped gate 176a and a second n-type doped gate 176b are respective gate contacts 76a, 76b.

Figure 5:
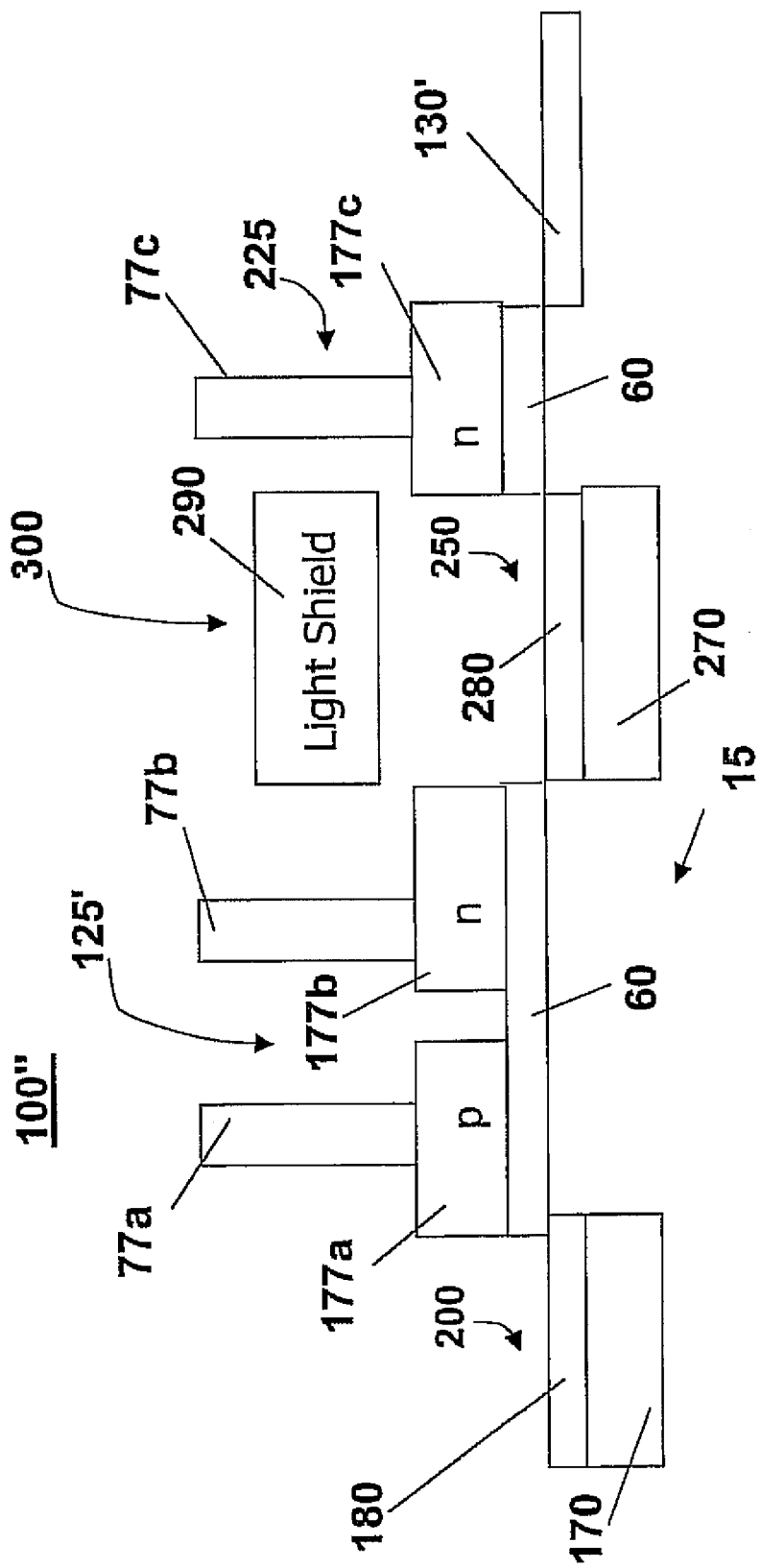
FIG. 5 illustrates, through a cross-sectional view, a CMOS APS cell 100'' having two distinct transfer gate structures, each doped of opposite conductivity, and, having separate transfer gate electrode (contact conductors) formed on each respective gate structure, and, including an intermediate storage node including a diode operable for global shutter operation according to a third embodiment of the invention.

A further alternate embodiment of the invention is depicted in FIG. 5, which shows the resulting transfer gate structure for the APS cell 100' shown in FIG. 4, but includes a further intermediate node 300 having a second storage diode 250 operable for global shutter operation. Thus, FIG. 5 illustrates, through a cross-sectional view, a CMOS imager APS 100" including first photosensing device, e.g., photodiode 200 formed at one side of a silicon-containing, e.g., polysilicon transfer gate device 125' as in the second embodiment of the invention described herein with respect to FIG. 4 including a first p-type doped gate structure 177a and a second n-type doped gate structure 177b separated a small distance, e.g., 100 nm +/−100 nm, and each formed over the thin dielectric layer 60. It is understood that in this alternate embodiment shown in FIG. 5, the first transfer gate device 125' may comprise a diodic type of gate having an anodic (p-type doped) region and abutting cathodic (n-type doped) region as in the first embodiment of the invention described herein with respect to FIG. 3. Irrespective of the first transfer gate 125' configuration, formed on each respective first p-type doped gate structure 177a and second n-type doped gate structure 177b are respective gate contacts 77a, 77b. Further in the alternate embodiment of FIG. 5, replacing the diffusion region 130 of the embodiments of FIGS. 3 and 4, on the other side of the transfer gate structure 125' is an intermediate node 300 including a second transfer gate device 225 including an n-type doped gate conductor layer 177c having a gate electrode 77c formed thereon. Formed on one side of the second transfer gate device 225 and abutting the cathodic (n-type doped) region of the first transfer gate 125' is a second storage diode device structure, e.g., a pinned diode 250 comprising respective p-type doped top layer 280 and underlying n-type doped collection layer 270 over the p-type substrate, operable for global shutter operation. As shown, above the second photosensing device structure in FIG. 5 is a light shield element 290. Formed at the other side of the second transfer gate device 225 is an n-type doped region or layer 130' providing a source or drain diffusion for the second transfer gate that receives collected charge carriers from the storage diode device. The configuration of the CMOS imager APS 100" shown in FIG. 5 facilitates and permits global shutter application by allowing the photodiode 250 and storage diode diffusion to be similar diffusions with similar structures, e.g., the source and drain implants can be the same thus saving processing cost.

Figure 6A:
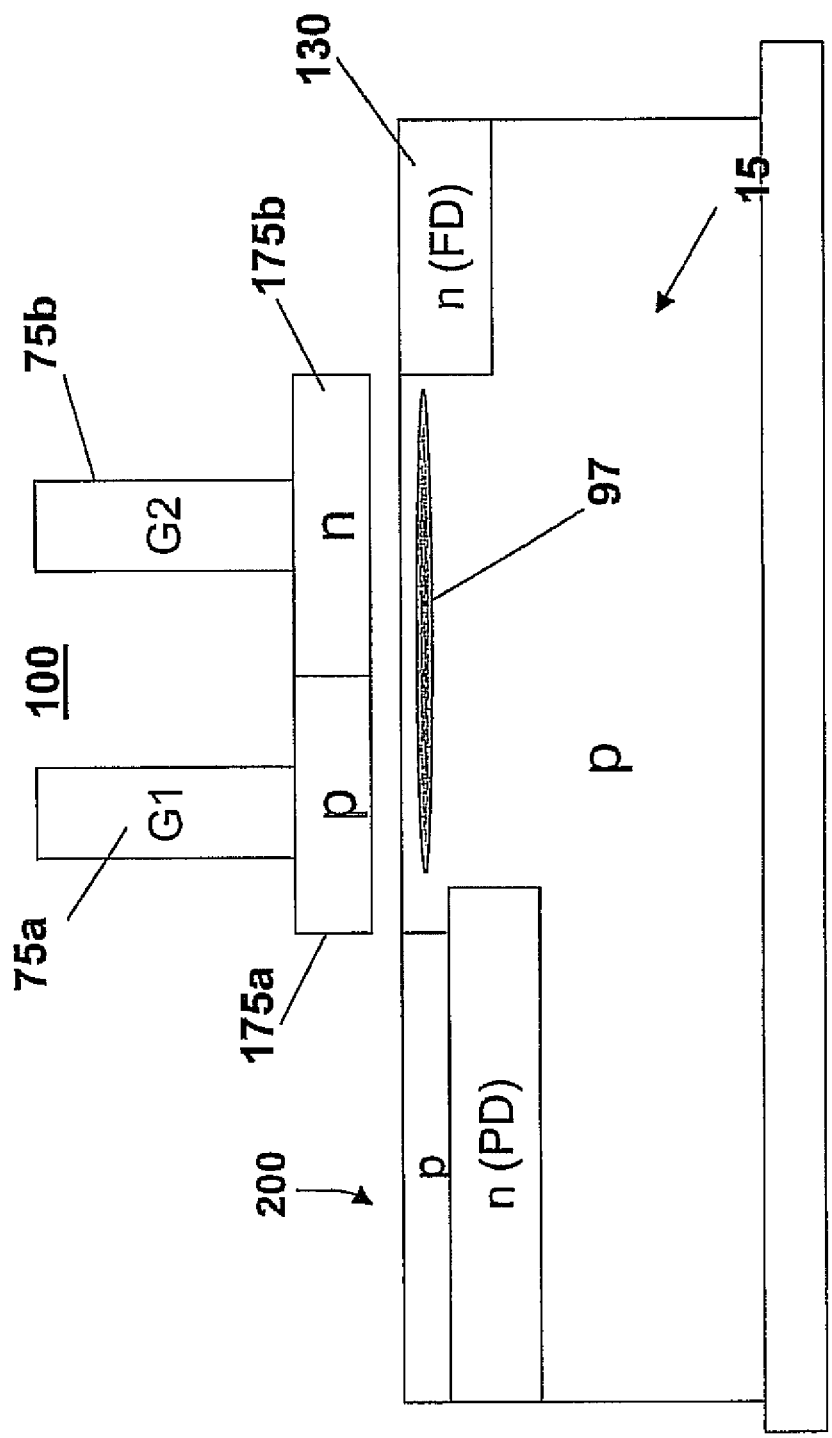
FIGS. 6A-6C depict a technique for reading the value of accumulated charge at the photodiode 200 for the embodiment shown in FIG. 3.
Figure 6B:
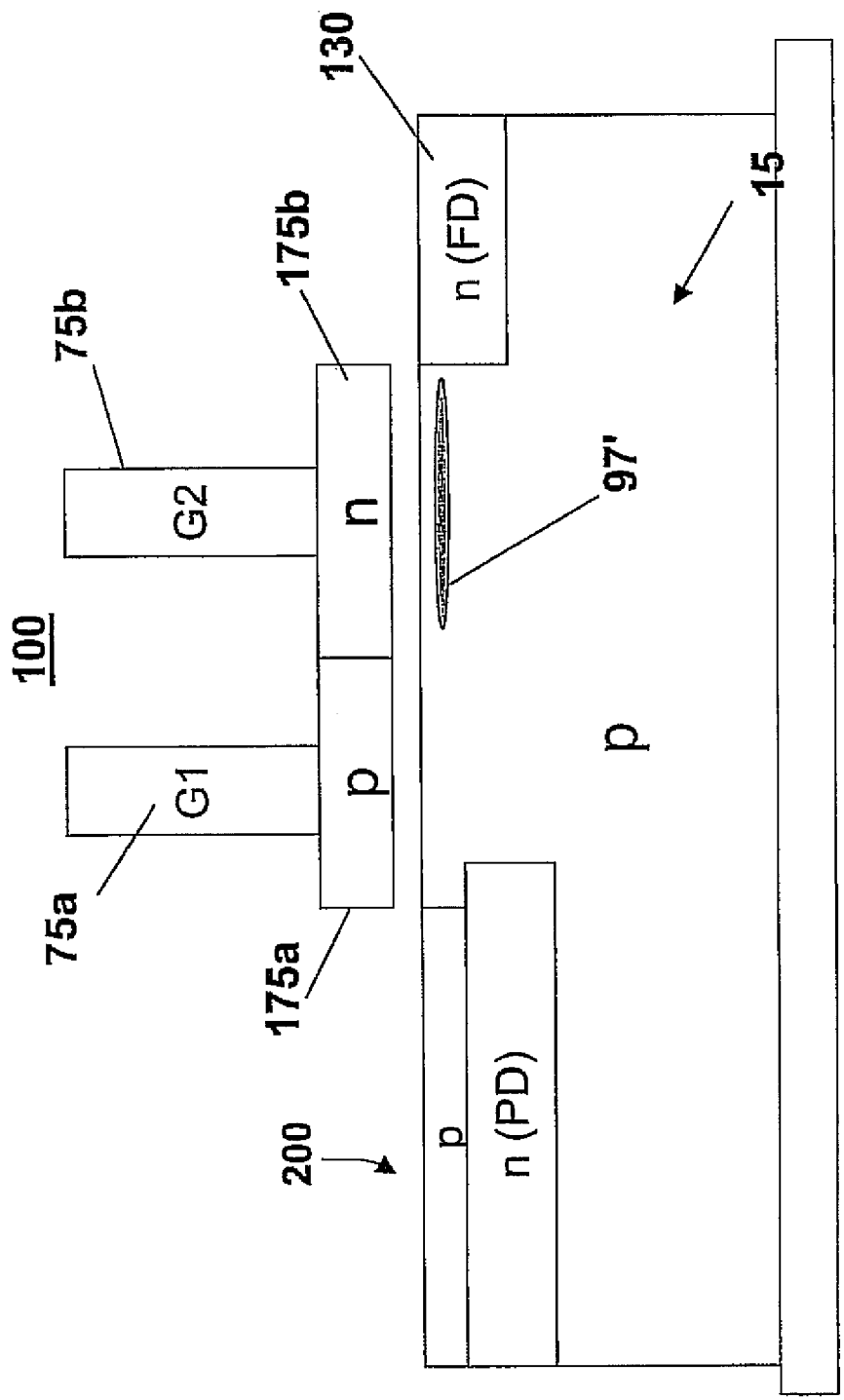
Figure 6C:
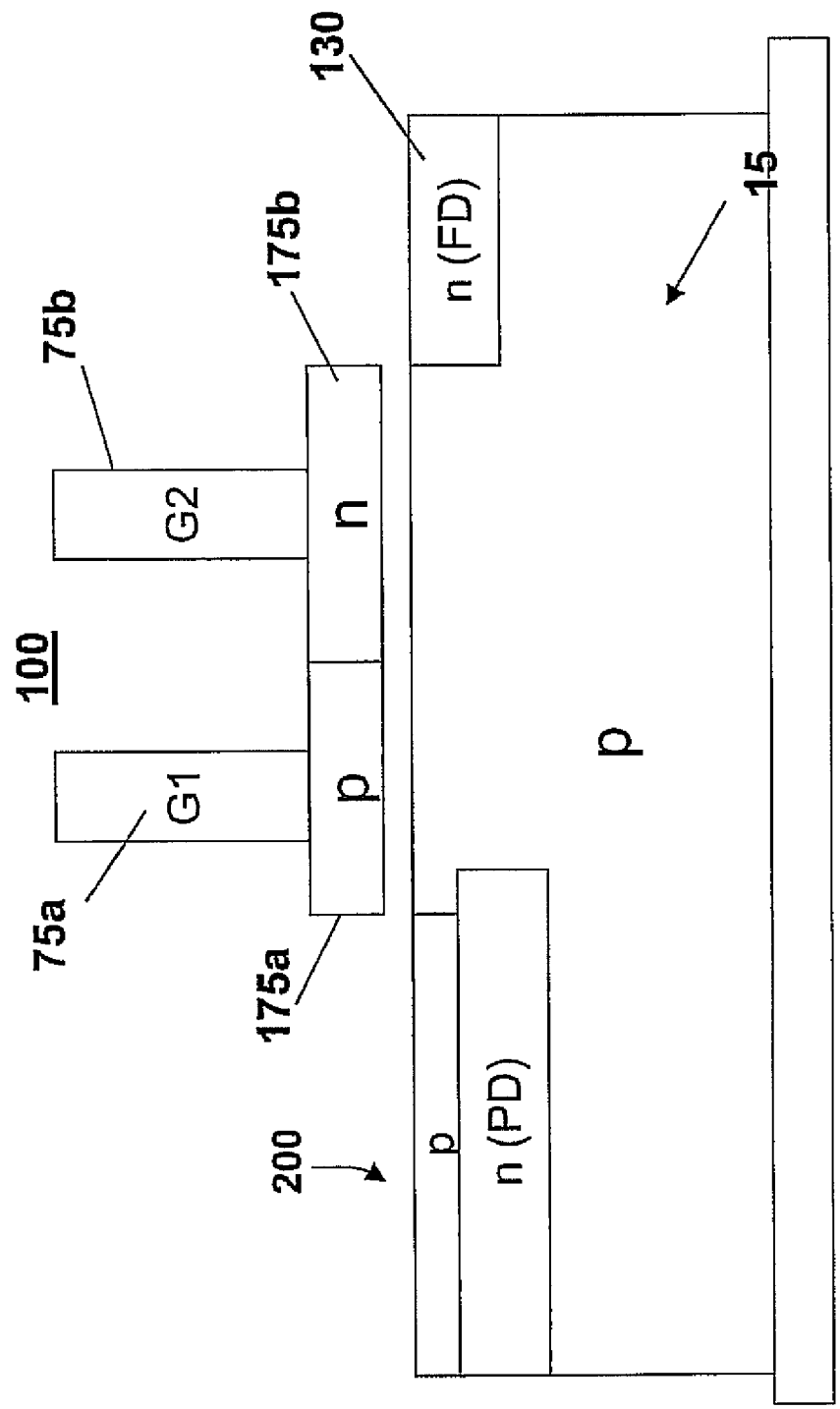

In accordance with the embodiments depicted in FIGS. 3 and 6, a methodology for operating the CMOS APS cell requires application of two different potentials to clock the charges out of the photodiode without allowing the charges to "spill-back". FIGS. 6A-6C depict a technique for reading the value of accumulated charge at the photodiode 200 for the embodiment shown in FIG. 3. It is understood however, that the technique is equally applicable to each of the embodiments described in FIGS. 4 and 6, in addition.

Figure 7:
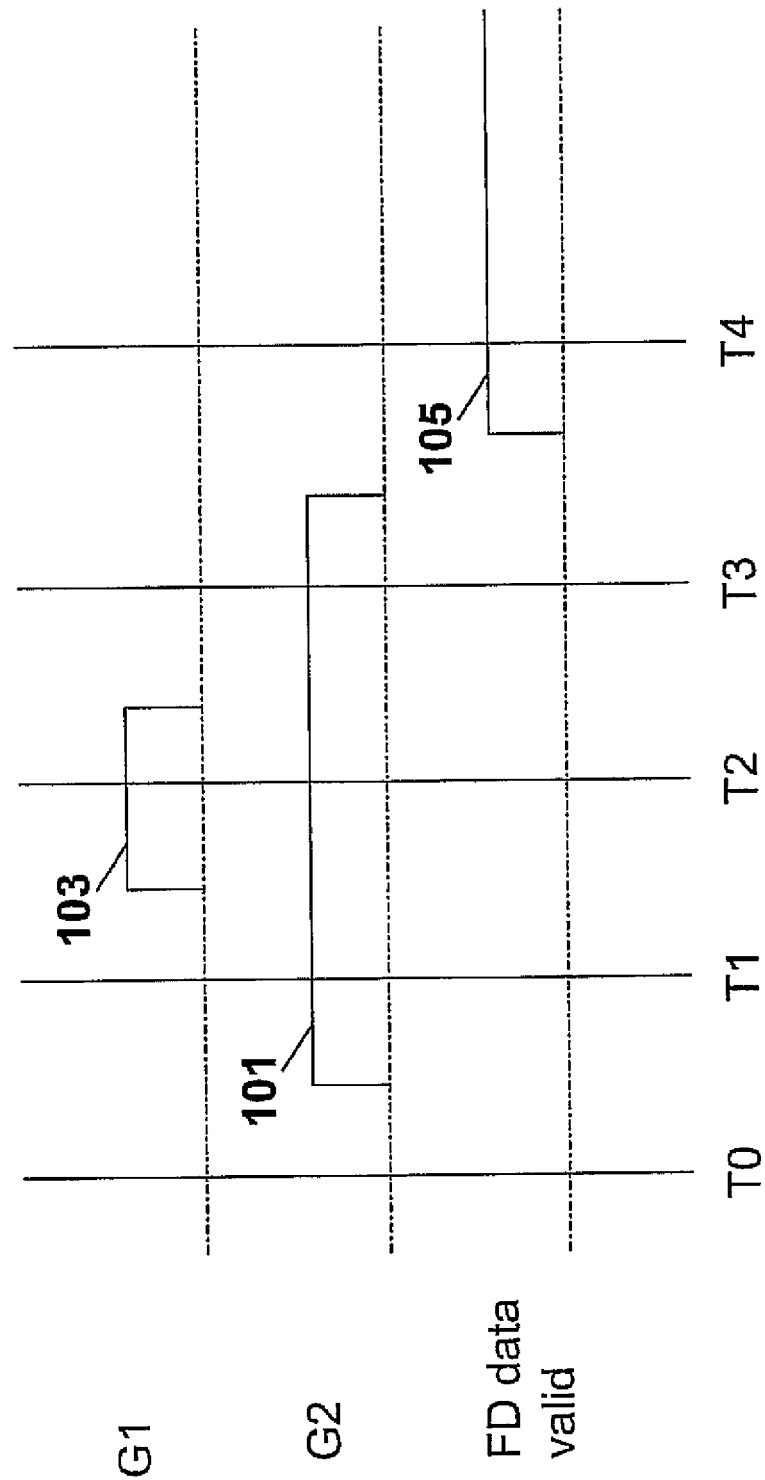
FIG. 7 illustrates, a timing diagram for operating a charge transfer from the photodiode 200 for the embodiment shown in FIG. 3.

With reference to the timing diagram in FIG. 7, at time T0 a photodiode 200 has stored charges generated by light illumination that will need to be read out to the floating diffusion 130. As shown in FIG. 7, the first step is to apply a voltage at transfer gate 175b (FIG. 6B) through transfer gate contact 75b. Thus, at time T1 in FIG. 7, this will result in an inversion layer 97' to be formed under the transfer gate 175b, (as seen in FIG. 6B) with charges from the floating diffusion 130. Assuming a time axis in nanoseconds, time intervals T0-T1, T1-T2 may range from as few as 10 nanoseconds to as much as 10 microseconds in duration. In one embodiment, the time axis interval is 500 ns. The applied voltage range needs to be sufficient both to invert the channel 97' and also high enough to eventually fully deplete the photodiode 200. As the pinning potential of a photodiode will vary (depending upon application from about 0.5V (1V operation) to about 3V (5V operation) the potential on the transfer gate will need to be at least a Vt above the pinning potential or at least about 1V to about 5V with about 2.8-3.3V being preferred.

Next, transfer gate 175a receives an applied voltage 103 through transfer gate contacts 75a to bring its potential to about the same level as that of transfer gate 175b at time T2 in FIG. 7. It may be advantageous to increase this potential slightly above that of 175b, but the built in diode between 175a and 175b will limit this overdrive to about 0.4V. This will extend the inversion layer 97 beneath the whole transfer gate 175a and 175b as seen in FIG. 6A. Then, the voltage is removed from the first transfer gate or brought to a lower value, e.g., through gate contact 75a, to effectively create a reverse biased diode comprising gate portions 175a, 175b at time T3 in FIG. 7. In response to this, the inversion layer under the gate portion 175a is removed; however, the inversion layer 97' in the channel underlying transfer gate portion 175b remains. Then, in a next step, time T4 in FIG. 7, shown in FIG. 6C, the voltage is removed from the second transfer gate or brought to a lower value, e.g., through gate contact 75b, to effectively transfer all of the accumulated charge onto the floating diffusion (FD) region 130 indicated as valid data 105 at time T4. In this embodiment, no charge "spills back" to the photodiode 200 because of the high barrier created by the low voltage applied at the first transfer gate.

Figure 8:
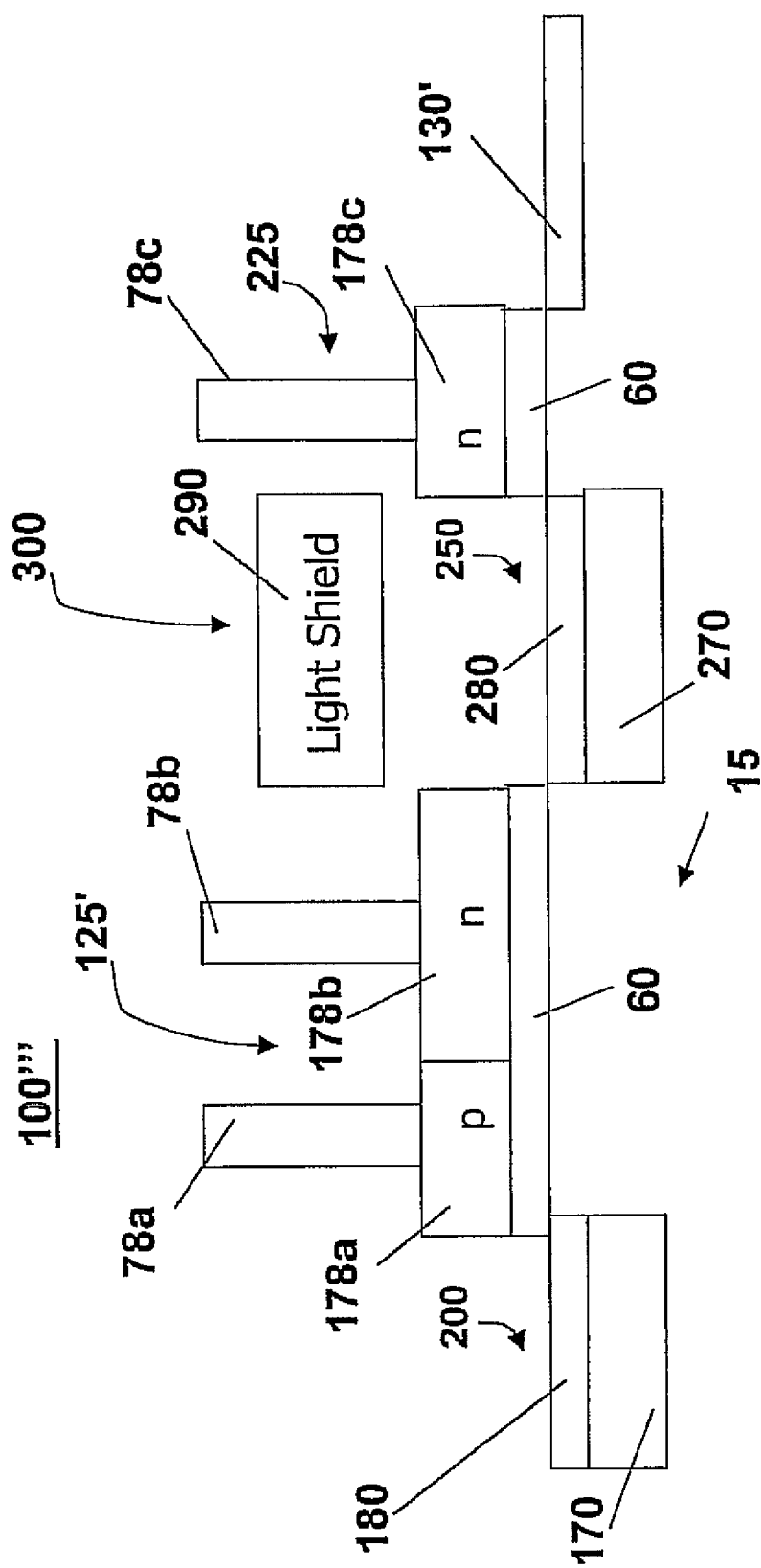
FIG. 8 illustrates, through a cross-sectional view, a CMOS APS cell 100''' having a diodic transfer gate structure, having separate transfer gate electrode (contact conductors) formed on each side of the diodic gate structure, and, including an intermediate storage node including a diode operable for global shutter operation according to a fourth embodiment of the invention.

In a further embodiment of the invention, FIG. 8 illustrates, through a cross-sectional view, a CMOS APS cell 100''' similar to the APS cell structure 100'' of FIG. 5, but including a diodic transfer gate structure 178a, 178b, and having respective separate transfer gate electrode (contact conductors 78a, 78b) formed on each side of the diodic gate structure, and, including an intermediate storage node 250 including a diode operable for global shutter operation. This structure further includes a second transfer gate device 225 including an n-type doped gate conductor layer 177c having a gate electrode 77c formed thereon.

Figure 9:
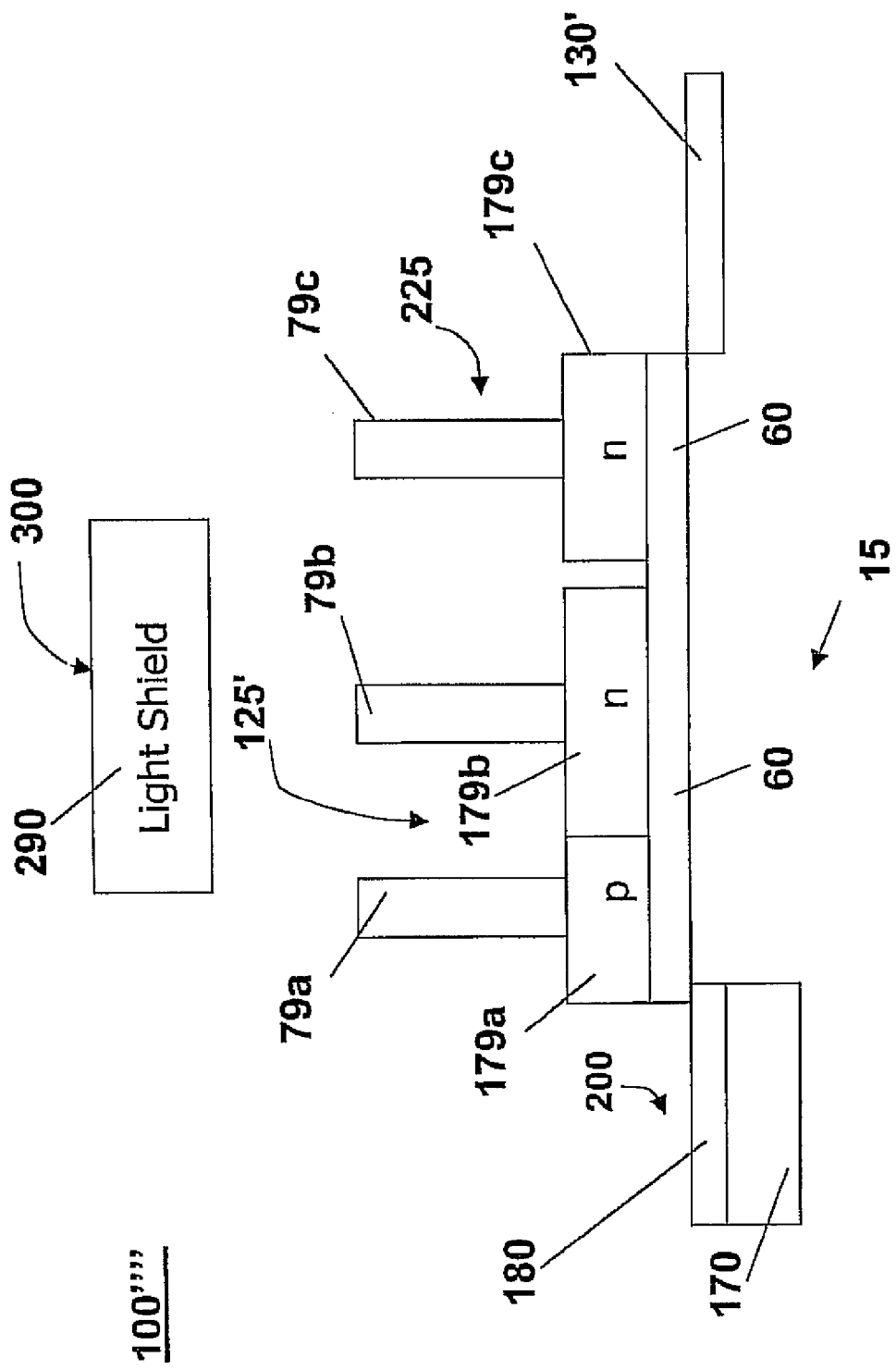
FIG. 9 illustrates, through a cross-sectional view, a CMOS APS cell 100'''' having a diodic transfer gate structure, having separate transfer gate electrode (contact conductors) formed on each side of the diodic gate structure, and, including an adjacent second transfer gate structure operable for global shutter operation according to a fifth embodiment of the invention; and, FIG. 10 illustrates, a timing diagram for operating a charge transfer from the photodiode 200 for the embodiment shown in FIGS. 5 and 8; and, FIG. 11 illustrates a schematic showing an example circuit topology within which embodiments from FIGS. 3, 4, and 6 are embedded.
Figure 10:
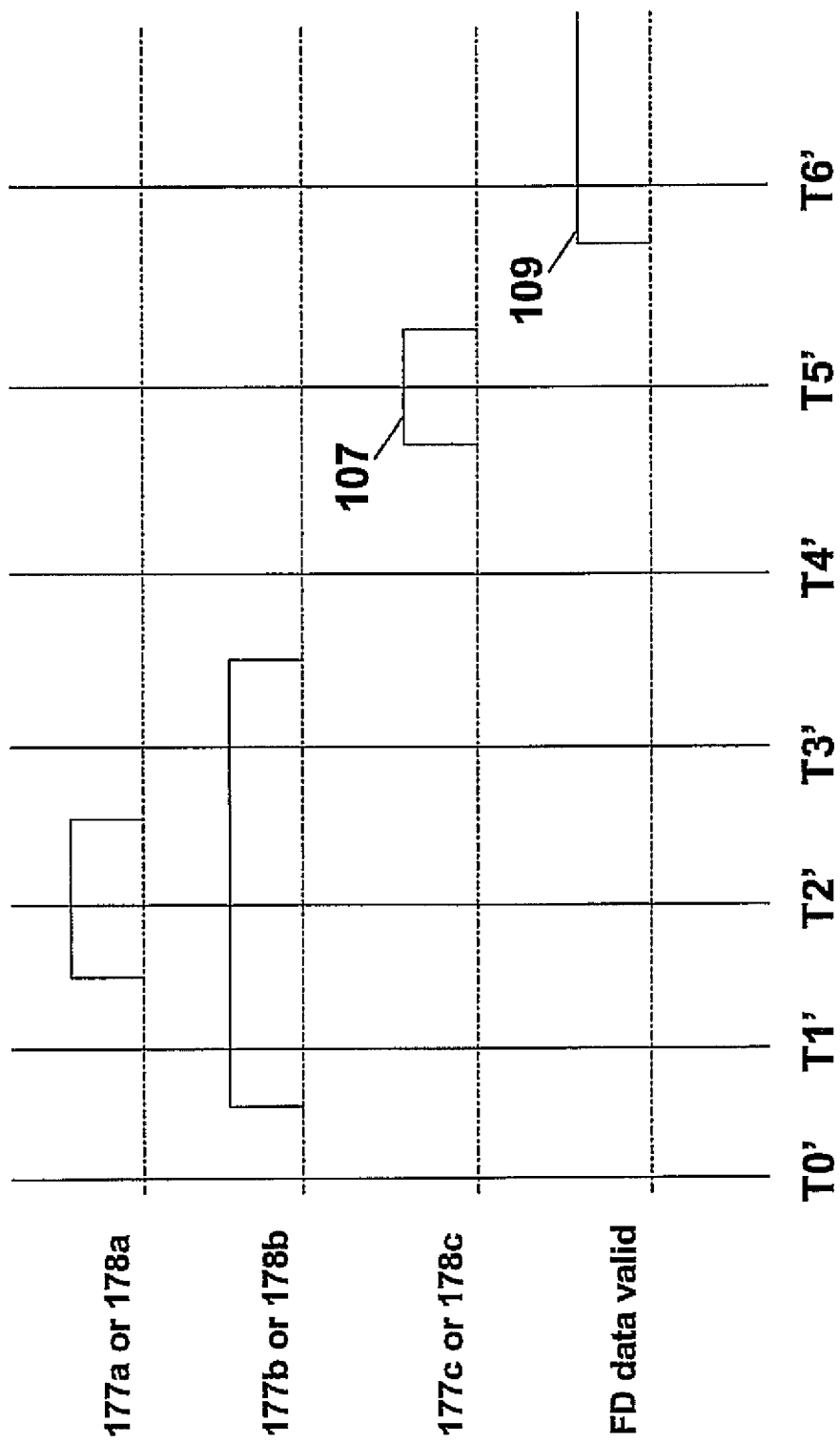
Figure 12:
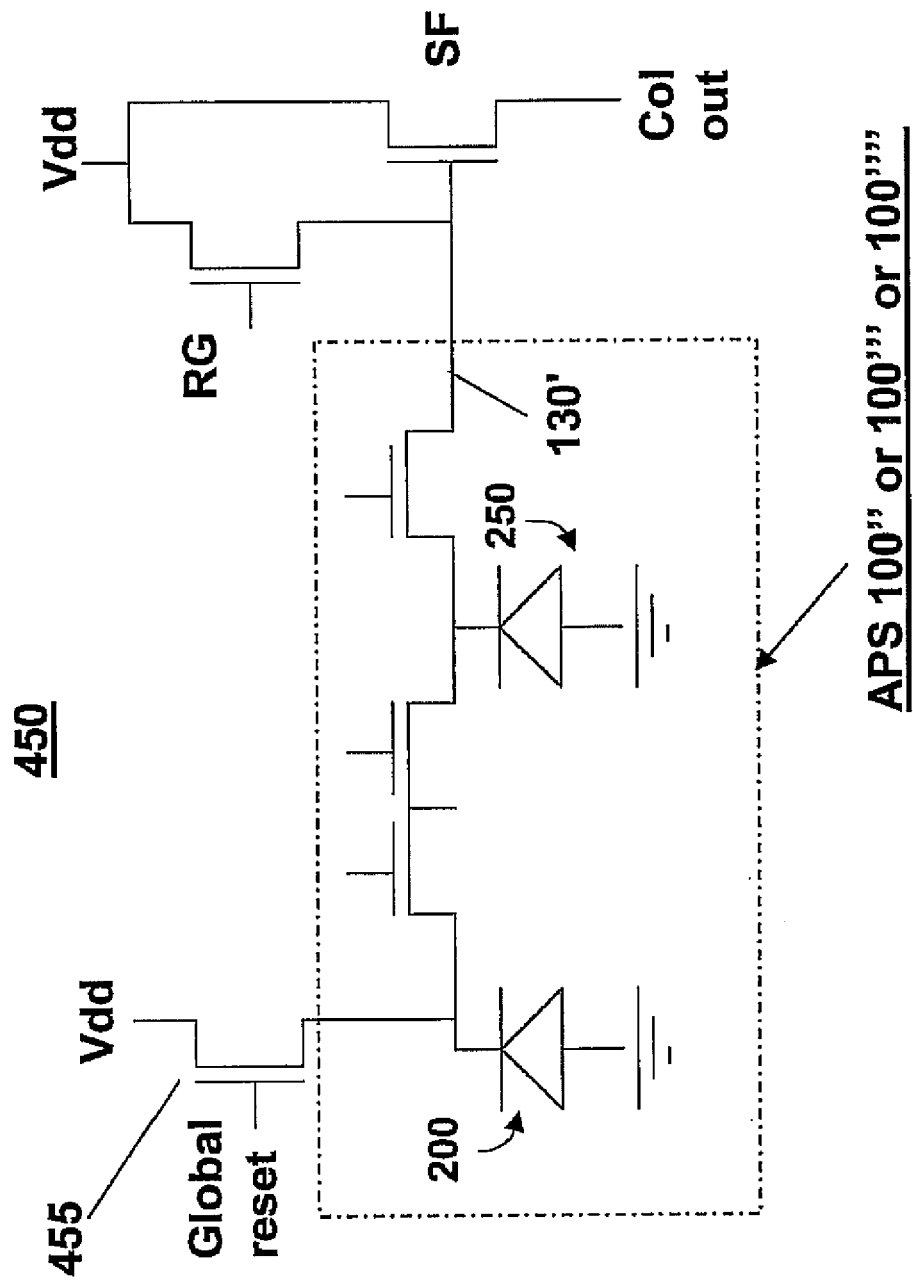
FIG. 12 illustrates a schematic showing an example circuit topology within which embodiments from FIGS. 5, 8, and 9 are embedded.

In accordance with the embodiments depicted in FIGS. 5 and 8, a methodology for operating the CMOS APS cell requires the application of three (3) different potentials to clock the charges out of the photodiode 200, store them at storage diode 250 and then to clock the charges from the storage diode to a final readout node 130'. FIG. 10 depicts a set of timing signals employed for reading the photodiode 200 applicable to each of the embodiments described in FIGS. 5 and 8, in addition. As before, with reference to FIG. 7, assuming a time axis in nanoseconds, time intervals T0-T1, T1-T2 may range from as few as 10 nanoseconds to as much as 10 microseconds, e.g., 500 ns, in duration. With reference to the timing diagram in FIG. 10, at time T0' the photodiode 200 has accumulated charges generated by light illumination that will need to be read out to the floating diffusion 130'. Just as in the timing diagram from FIG. 7, this set of timing diagrams T0'-T4' will transfer the charges from the photodiode 200 to the node following the transfer gate. In these embodiments, the charges are first transferred to a storage node 250 by applications of voltages to gate contacts 177b, 178b (in the embodiments of FIG. 5 and FIG. 8, respectively) at time T1' and at gate contacts 177a, 178a (in the embodiments of FIG. 5 and FIG. 8, respectively) at time T2'. This application is called global shutter because the circuit operation voltages are applied to all the pixels in the array at the same times T0' to T4', resulting in an instantaneous storage of the image data from the respective APS cells to the intermediate storage node 250. Now, as shown in FIG. 10, the next step is to read out the stored image from the storage node 250. Thus, a further step is performed to apply a voltage potential 107 to contact 178c (of the embodiment depicted in FIG. 8) or contact 177c (of the embodiment depicted in FIG. 5)) to turn on the inversion layer beneath the respective transfer gate 178c (embodiment of FIG. 8) or 177c (embodiment of FIG. 5) at time T5' as shown in FIG. 10. Now with storage node 250 designed appropriately so as to be fully depletable, the charge from node 250 can now be transferred to floating diffusion node 130' a row at a time and then read out each column in parallel through the column readout circuit as seen in FIG. 12. The transfer is completed at time T6' in FIG. 10 when the transfer gate voltage at 178c (FIG. 8) or 177c (FIG. 5) is brought low and all the charges comprising valid data 109 are now present on floating diffusion node 130'. In a further embodiment of the invention, FIG. 9 illustrates, through a cross-sectional view, a CMOS APS cell 100'''' having a diodic transfer gate structure 179a, 179b, having respective separate transfer gate electrode (contact conductors 79a, 79b) formed on each side of the diodic gate structure, and, including an adjacent second transfer gate structure 179c through gate contact 79c operable for global shutter operation. As shown in FIG. 9, in one embodiment depicted, the formed diodic transfer gate structures 179a, 179b are respectively p-type doped and n-type doped similar as in the other embodiments shown and described. The adjacent second transfer gate structure 179c is formed approximately 100 nanometers +/100 nm from the n-type doped diodic transfer gate structure 179b with the substrate channel being defined under the gate dielectric layer between the photosensing device 200 and the floating diffusion region 130'. Moreover, as shown in FIG. 9, a light shield structure is formed above the n-type diodic gate region 179b and corresponding gate electrode 79b, in order to prevent light from reaching an inversion layer formed under the n-type diodic gate region 179b when transferring accumulated charge to the floating diffusion during a photosensing device read operation as will be explained in greater detail hereinbelow.

In accordance with the embodiments depicted in FIGS. 9 and 14A-14C, a methodology for operating the CMOS APS cell requires the application of three (3) different potentials to clock the charges out of the photodiode 200, store them under a portion of transfer gate 179b, and then to clock the charges from this stored location 179' to a final readout node 130'.

Figure 13:
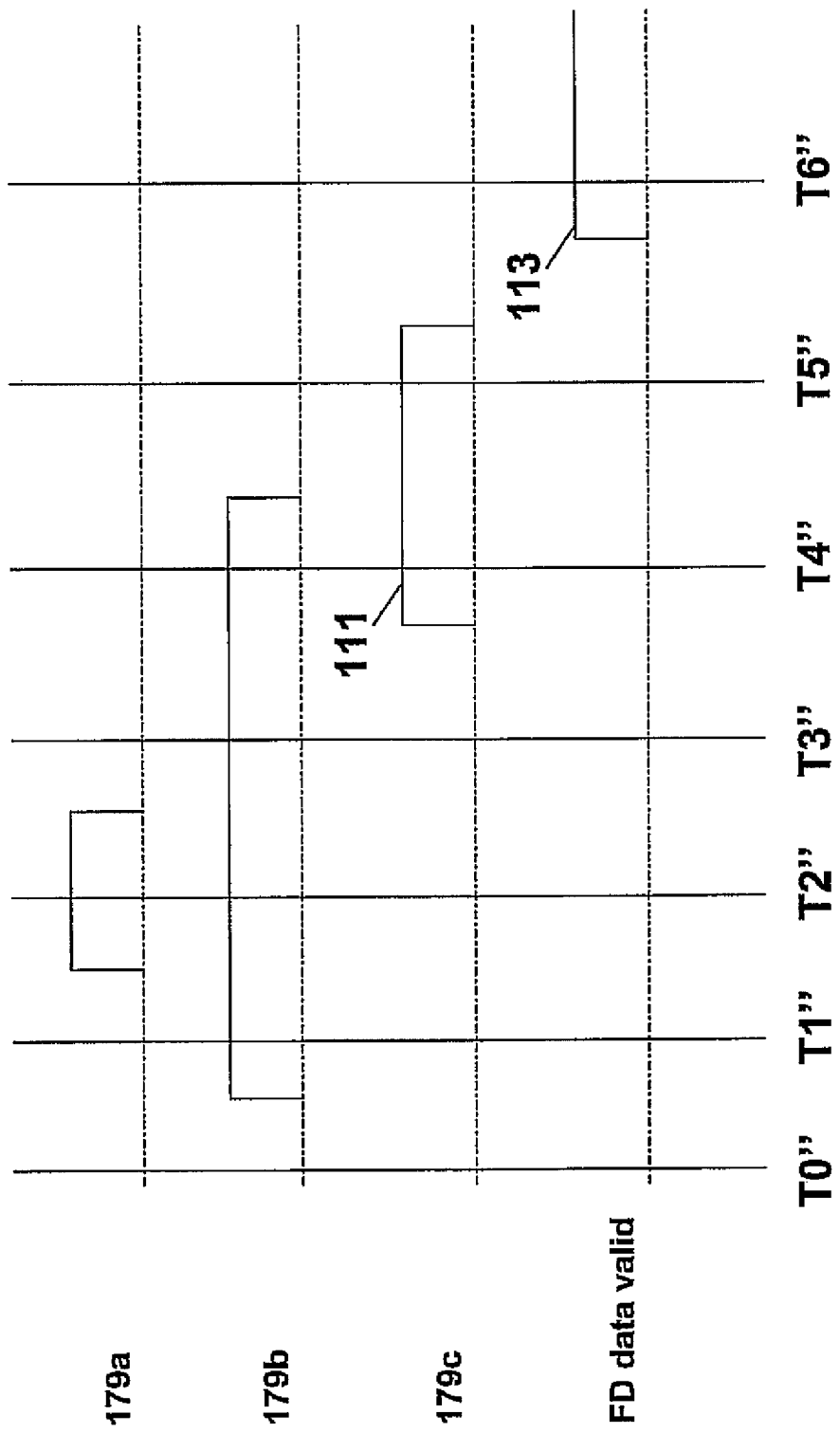
FIG. 13 illustrates a timing diagram for operating a charge transfer from the photodiode 200 for the embodiment shown in FIG. 9; and, FIGS. 14A-14D depict a technique for reading the value of accumulated charge at the photodiode 200 for the APS embodiment shown in FIG. 9.
Figure 14A:
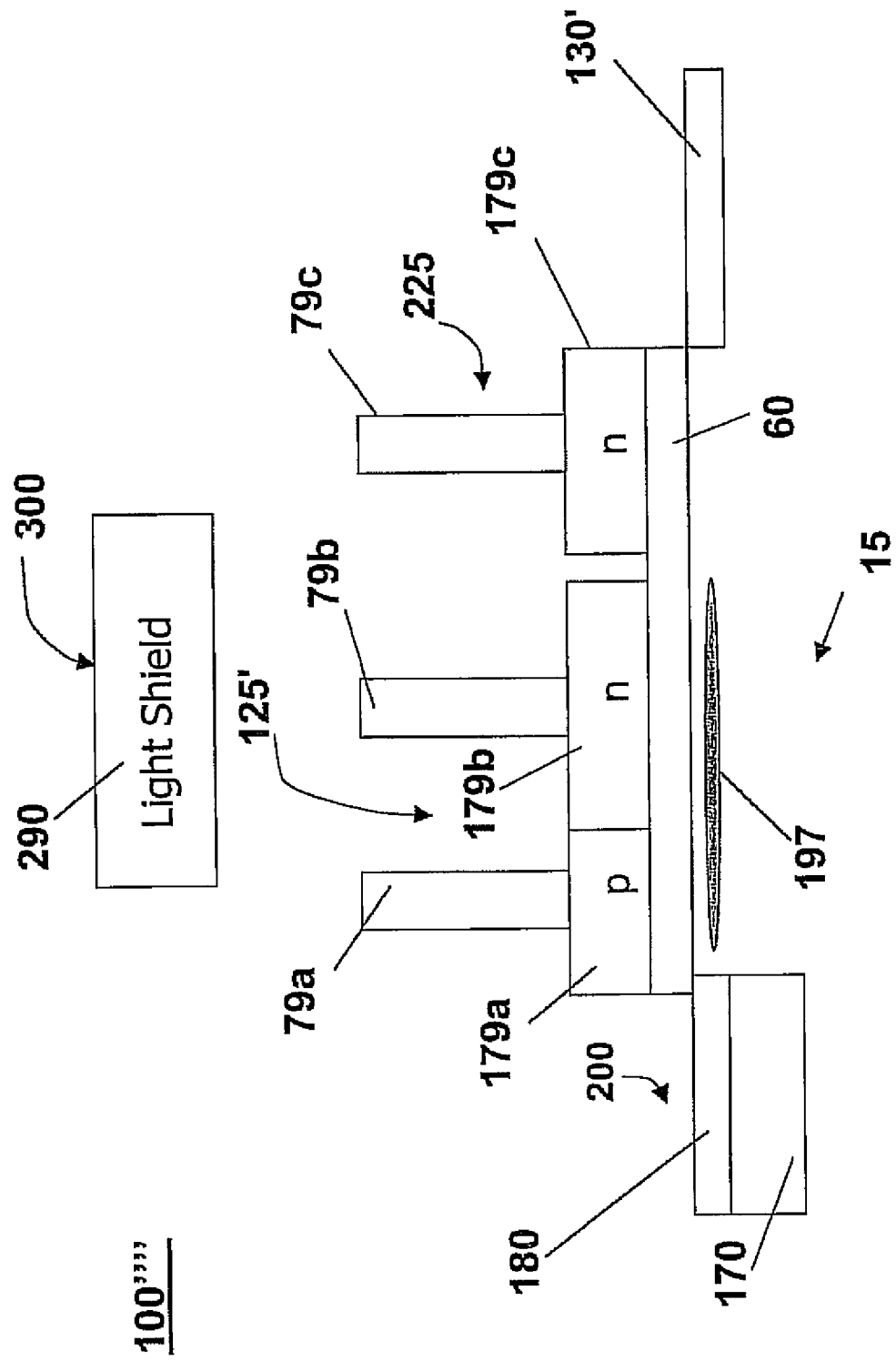
Figure 14B:
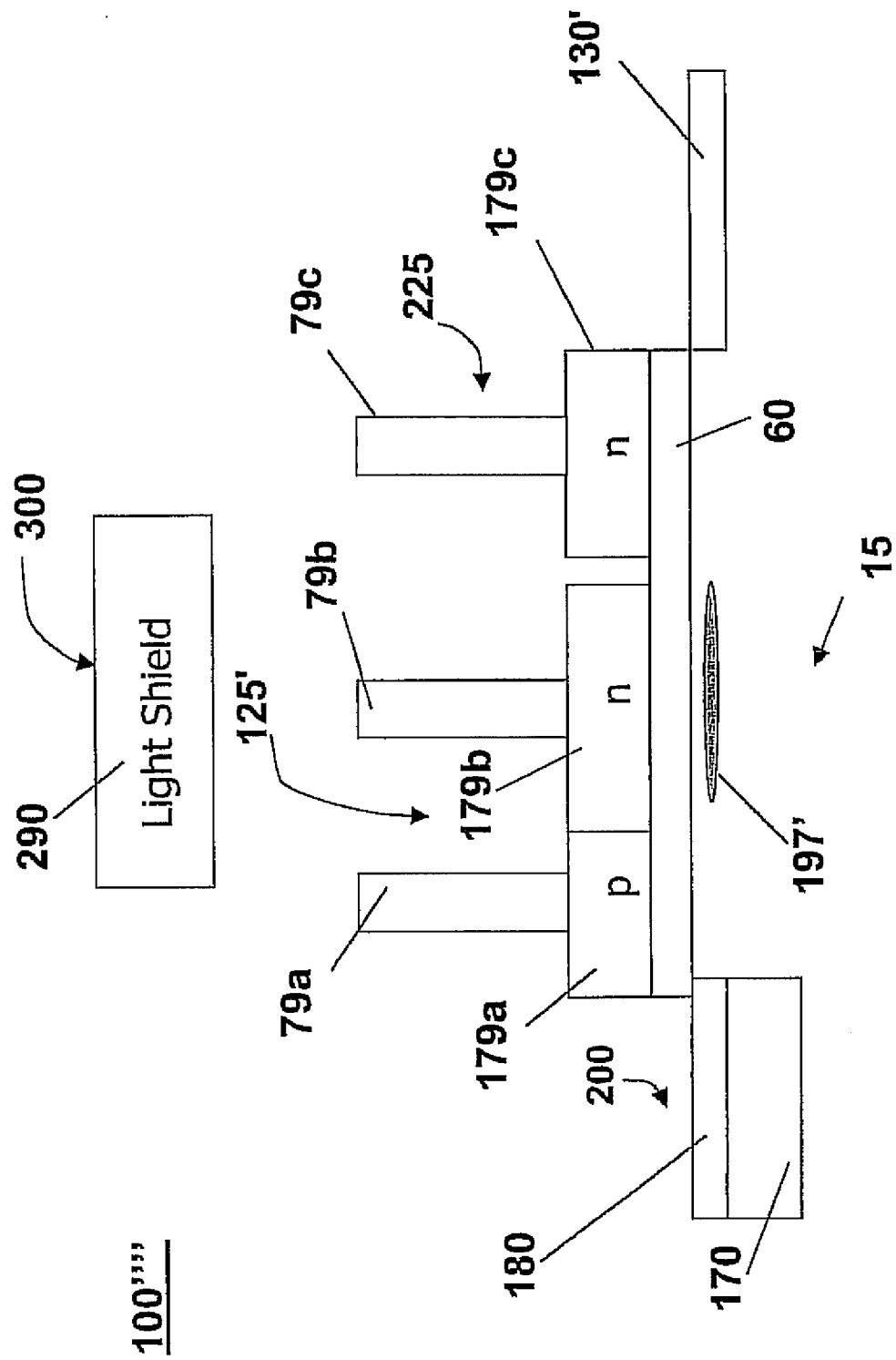
Figure 14C:
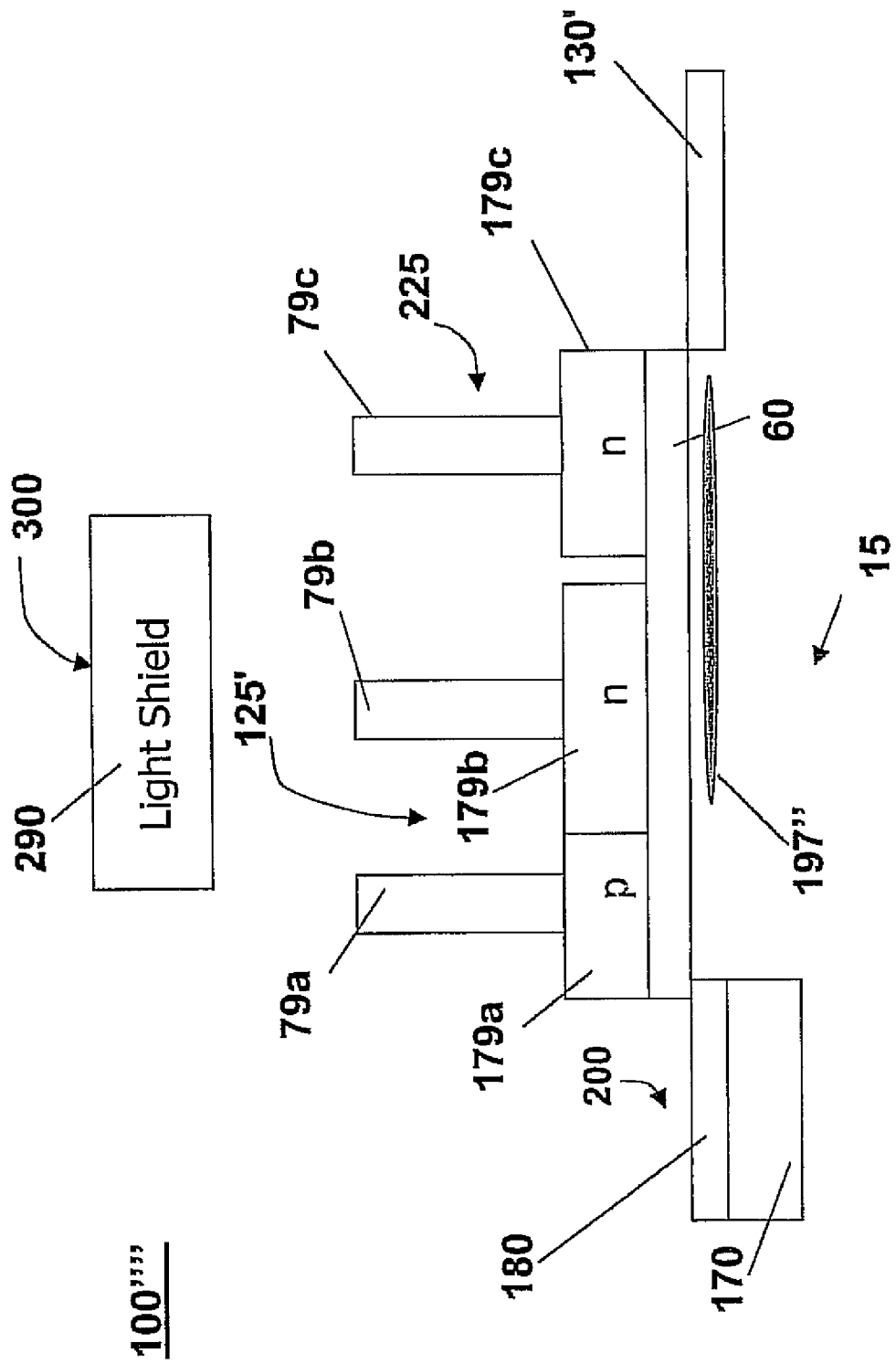

FIG. 13 depicts a set of timing diagrams for reading the photodiode 200 applicable to the embodiment described in FIGS. 9 and 14. At time T0'' photodiode 200 has accumulated charges generated in response to light illumination. This would normally have involved resetting the photodiode and then waiting a period of time for the charges to be generated in the photosensitive region. As before, with reference to FIG. 7, assuming a time axis in milliseconds, time intervals T0-T1, T1-T2 may range between 10 ns and 10 us in duration. As shown in FIG. 13, the first step is to bring a voltage potential up to transfer gate 179b. This is done on 179b first so as to avoid forward biasing the diode built into the transfer gate at time T1'' in FIG. 13. This is followed by raising the potential on 179a, time T2'' in FIG. 13, to create an inversion layer 197 from the charges that were resident in the photodiode 200 and fully depletes photodiode 200 as seen in FIG. 14A. Subsequently, transfer gate 179a is brought low and the inversion layer 197' is now localized beneath transfer gate 179b as seen in FIG. 14B at time T3''. Timesteps T0''-T3'' are applied globally occurring to all the pixels in the array at substantially the same time as part of a global shutter operation. Now with the charges stored in the inversion layer 197' which is protected from light by the light shield 300 formed over the n-doped conductor layer of the first transfer gate device 179b, the array is then typically read out to the columns a row at a time. This readout process proceeds as follows: First the second transfer gate 179c has its voltage potential 111 raised, which extends the inversion layer 197" under both 179b and 179c as seen in FIG. 14C at time T4". Then the applied voltage at transfer gate 179b is lowered and the charges are transferred to the inversion layer 197''' and to the floating diffusion 130' as seen in FIG. 14D at time T5". Lastly, transfer gate 179c potential is lowered and all charges comprising valid data 113 are deposited on floating diffusion 130' and subsequently may then be read out through the column circuit. That is, the transfer is completed at time T6''' in FIG. 13 when the transfer gate voltage at 179c (FIG. 9) is brought low and all the charges comprising valid data 113 are now present on floating diffusion node 130'. Note that while timesteps T4"-T6" take place quickly for one pixel. (within the order of the 10 ns to 10 μs range), reading the entire pixel array will take significantly longer as each of potentially millions of pixels will have to be read out.

Figure 11:
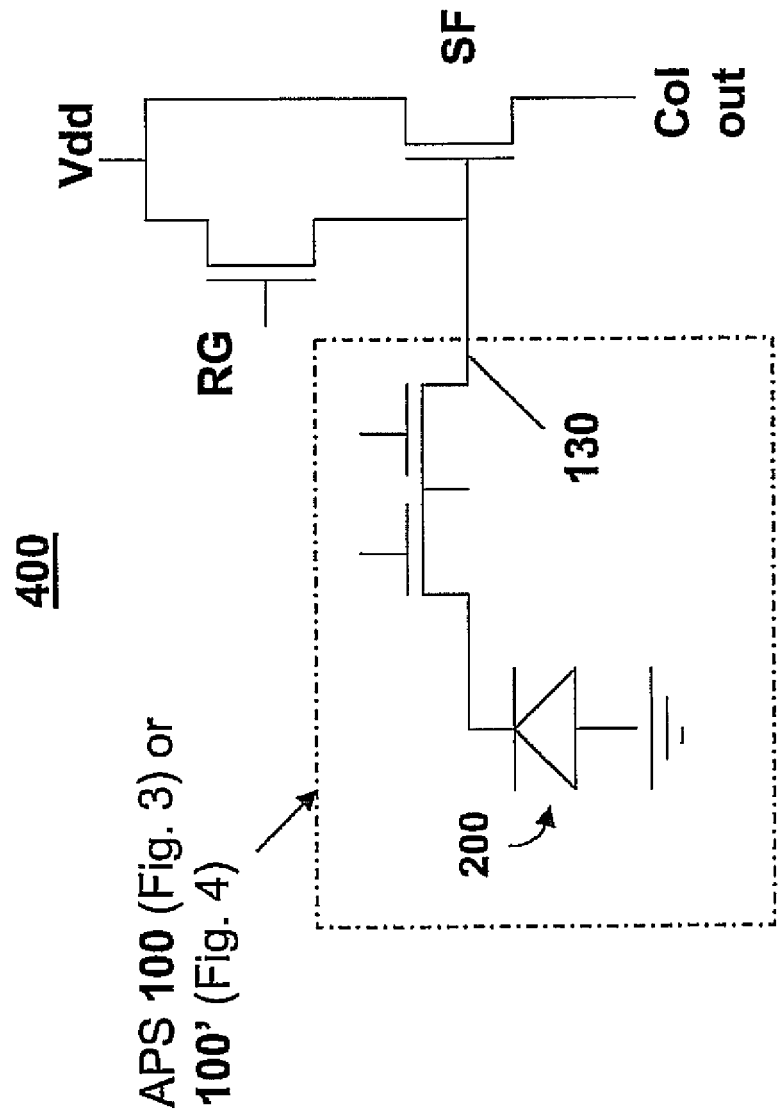

FIG. 11 illustrates a schematic 400 showing an example circuit topology within which embodiments of the CMOS APS cell 100 (depicted in FIG. 3) or CMOS APS cell 100' (depicted in FIG. 4) are embedded. In FIG. 11, the pixel device 100 (100') including the one diffusion comprising the photo diode 200 which collects the incident light, includes the floating diffusion 130 which is connected to the source of a Reset device having a reset gate (RG), and the drain of the reset device is connected to Vdd which also serves as the reset voltage. Note that alternatively, the drain of the reset device may be connected to a separate reference voltage Vref, different from Vdd, and serves as the reset voltage. The voltage of the reset gate RG is commonly 5V and it should be at least one threshold voltage higher than the reset voltage Vdd. The floating diffusion 130 of the pixel device is also connected to the gate of N-channel MOS readout transistor (SF) having a drain terminal connected to Vdd and the source of NFET SF is connected to a column output line.

It is understood that, in alternate embodiments, the source of the N-channel MOS readout transistor SF may be further connected to the drain of a further N-channel MOS transistor row select device (not shown) having a source that would comprise the pixel output, and whose gate would be controlled by a row select line (not shown).

Similarly, in FIG. 12, for the global shutter operations, column readout circuit 450 is provided for the pixel devices 100" (100''' and 100'''') (FIGS. 5, 8 and 9 respectively). In FIG. 12, the pixel devices 100" (100''' and 100'''') include the first diffusion comprising the photo diode 200 which collects the incident light and the second storage diode 250, and the floating diffusion 130' which is connected to the source of a Reset device having a reset gate (RG), and the drain of the reset device is connected to Vdd which also serves as the reset voltage. The floating diffusion 130' of the pixel device is also connected to the gate of N-channel MOS readout transistor SF having a drain terminal connected to Vdd and the source of NFET SF is connected to a column output line. Readout operation of the floating diffusions in each embodiment is the same. However, in the embodiment of FIG. 12, a further global reset transistor 455 is provided to provide a Vdd voltage source for pinning the photodiode to a constant voltage value, e.g., when the photodiode is fully depleted.

Although not shown, one example methodology for producing the CMOS imager APS 100 structure shown in the embodiments of FIGS. 3, 4, 5, 6, 8, and 9 is now described. It is understood that other techniques may be used for forming the transfer gate having the diode structure, i.e., abutting or separated p-type and n-type gate poly regions, as known in the art. The device 100 (FIG. 3), 100' (FIG. 4) and 100" (FIG. 5) is formed on a substrate 15 which may be a bulk semiconductor including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description, substrate 15 is a Si-containing semiconductor substrate of a first conductivity type, e.g., lightly doped with p-type dopant material such as boron or indium (beryllium or magnesium for a III-V semiconductor), to a standard concentration ranging between, e.g., $1 \times 10^{14}$ to $1 \times 10^{16}$ cm$^{-3}$. Next, a dielectric material layer 60 is formed by standard deposition/growth techniques atop the substrate 15 that will form the eventual transfer gate dielectric. The dielectric layer may be formed to a thickness ranging between 40 Å to 100 Å, for example, and may comprise suitable gate dielectric materials including but not limited to: an oxide (e.g., SiO$_2$), a nitride (e.g., silicon nitride) an oxynitride (e.g, Si oxynitride), N$_2$O, NO, ZrO$_2$, or other like materials. In one embodiment, the gate dielectric 60 is comprised of an oxide such as, for example, SiO$_2$, HfO$_2$, ZrO$_2$, Al$_2$O$_3$, TiO$_2$, La$_2$O$_3$, SrTiO$_3$, LaAlO$_3$, and mixtures thereof. The dielectric layer 60 is formed on the surface of the Si-containing semiconductor substrate 15 using conventional thermal oxidation or by a suitable deposition process such as chemical vapor deposition, plasma-assisted chemical vapor deposition, atomic layer deposition (ALD), evaporation, reactive sputtering, chemical solution deposition and other like deposition processes. The gate dielectric 16 may also be formed utilizing any combination of the above processes. Although it is not shown, it is understood that the dielectric layer may comprise a stack of dielectric materials.

Next, a Silicon-containing layer, e.g., polycrystalline silicon, is formed atop the dielectric layer 60 using conventional deposition processes including, but not limited to: CVD, plasma-assisted CVD, sputtering, plating, evaporation and other like deposition processes (e.g., a low pressure CVD). The polysilicon layer may be formed to a thickness ranging between about 1 $k$ Å to 2 k Å but may be outside this range. Alternatively, the Silicon-containing layer may comprise a stack of polysilicon layers.

Prior to forming the transfer gate structure, whether in the embodiments depicted in FIGS. 3, 4, 5, 6, 8 and 9, including the intrinsic polysilicon layer on the gate dielectric layer, a subsequent mask deposition process that covers a portion of the transfer gate structure and ion implantation process is performed to implant dopant material of a second conductivity type, e.g., n-type dopant material, such as phosphorus, arsenic or antimony, into the polysilicon layer to form n-type doped gate poly portion, e.g., 175b in the embodiment as shown in FIG. 3. The n-type dopant material may be implanted to achieve a dosing concentration ranging between $1 \times 10^{17}$ cm$^{-3}$ to about $1 \times 10^{20}$ cm$^{-3}$. Similarly, using a subsequent mask deposition process that covers the remaining portion, i.e., the other side of the transfer gate structure, an ion implantation process is performed to implant dopant material of a first conductivity type, e.g., p-type dopant material, such as boron or gallium or indium into the polysilicon layer to form p-type doped gate poly portion, e.g., 175a in the embodiment as shown in FIG. 3. The p-type dopant material may be implanted to achieve a dosing concentration ranging between $1 \times 10^{17}$ cm$^{-3}$ to about $1 \times 10^{20}$ cm$^{-3}$, in an example embodiment, in the gate poly layer. Alternately, the doping of the polysilicon may be achieved using implants already present in the process by appropriate use of those implant masks at the same time those implants are being performed elsewhere in the chip.

It should be noted that in a variation of the method described, in-situ n-type, p-type doped, or both n-type and p-type polysilicon material may be deposited on top of the gate dielectric layer 60 according to an in-situ doping deposition process or deposition (e.g., CVD, plasma-assisted, etc.). The in-situ doping deposition process, for example, may be employed when the gate dielectric cannot withstand a subsequent high temperature annealing, whereas ion implantation and annealing can be employed when the gate dielectric is a material that can withstand such high temperature annealing.

The diodic transfer gate is then formed by a photolithographic process, e.g., applying a mask, e.g., a photoresist layer, over the polysilicon layer and applying a mask patterned to define the gate region, e.g., the effective channel length of the transfer gate to be formed, and then developing the resist and performing an etch process. Basically, an etch window is provided in a resist mask, the size and shape of which approximately defining the lateral size and shape of the gate region to be formed. Then, one or more etch processes are performed, e.g., a reactive ion etch (RIE) process, that is optimized to ensure proper etching of the polysilicon layer and dielectric layer 60 or dielectric layer stack to result in the transfer gate structure. Further mask and etch processes may optionally be performed, for example, so that the transfer transistor gate structure 125' (of FIGS. 4, 5, and 9) is split to have two distinct gate structures separated by a small distance. For example, depending upon the lithography generation, the standard poly etch may be able to define the transfer gate structure without an extra step.

After optionally forming transfer gate sidewall and any spacers, a next step is performed to provide the photodiode pinning region 180. This step comprises forming a photoresist layer (not shown) patterning, and creating an ion implantation mask according to techniques known in the art to form a mask edge approximately coincident with the gate edge or as close as possible given alignment tolerances, to provide an opening to an area between an edge of the gate and a formed isolation region, e.g., STI region (not shown), where the charge accumulation region of the photodiode is to be formed. This opening permits the implantation of ions of p-type dopant material, e.g., such as boron, at a concentration sufficient to form the p-type dopant pinning region 180 as shown in FIGS. 3, 4, 5, 8, 9. This pinning region 180 may be formed up to the edge of a spacer (not shown). The active p-type dopant material is then ion implanted at dosing concentrations ranging between $1 \times 10^{17}$ and $1 \times 10^{19}$ cm$^{-3}$, in an example embodiment. It should be understood that, alternatively, the p-type pinning photodiode surface layer 180 may be formed by other known techniques. For example, the p-type surface layer 180 may be formed by a gas source plasma doping process, or by diffusing a p-type dopant from the in-situ doped layer or a doped oxide layer deposited over the area where photodiode is to be formed.

A further step is then performed to ion implant the n-type dopant underneath the p-type doped region 180 of the substrate surface of the photodiode element 200. Potentially, the same ion implantation mask could be used as when implanting the p-type material to form pinning region, an ion implantation process is performed to implant dopant material of the second conductivity type, e.g., n-type dopant material, such as phosphorus, arsenic or antimony, to form the charge collection layer beneath the ion implanted p-type pinning layer 180. The n-type dopant material is implanted at higher energy levels to form the n-type doped region 170 of the photodiode 200 as shown in FIGS. 3, 4, 5, 8, 9. The active n-type dopant material may be ion implanted at dosing concentrations ranging between $1 \times 10^{16}$ and $1 \times 10^{18}$ cm$^{-3}$, in an example embodiment.

A further step is performed to form the storage diode region 250. This region may optionally be formed using the same implants and masks as the photodiode 200, or it may be performed with unique masks and implants as was done for the photodiode 200 but with its own optimized surface layer 280 and storage layer 270 as shown in FIGS. 5 and 8.

In addition to the forming of the photodiode 200, an additional step of forming an n-type floating diffusion region 130 or 130' at the other side of the transfer gate is performed. This step comprises forming a photoresist layer and patterning and etching an ion implantation mask according to techniques known in the art to form a mask edge approximately coincident with the gate edge or as close as possible given alignment tolerances, to provide an opening allowing the implantation of n-type dopant material, such as phosphorus, arsenic or antimony, at a concentration sufficient to form the n+-type doped floating diffusion region 130 as shown in FIGS. 3, and 4, or alternately 130' in FIGS. 5, 8, and 9, or, up to the edge of a gate sidewall spacer (not shown). The active n+-type dopant material is ion implanted at the floating diffusion region at dosing concentrations ranging between $1 \times 10^{18}$ and about $1 \times 10^{20}$, in an example embodiment. As a result of this ion implantation step, n-type dopant materials may be additionally implanted at the doped transfer gate polysilicon layer 175b portion as well.

Thus, in accordance with the invention, both the source/drain and the poly gate doping approaches, a trade off of the "spillback" lag for photodiode reset-ability is created. That is, when the Vt is high at the photodiode side of the transfer gate, spill back is eliminated, but it is more difficult to extract all the carriers out of the photodiode due to the high barrier. However, when the Vt is lower at the photodiode 200, all the carriers are extracted from the photodiode under the transfer gate, however they may be redistributed back into the photodiode when the gate is turned off.

The invention thus uses Vt gradation across the transfer gate to create a built in field that funnels carriers from photodiode to the floating diffusion area. In one embodiment, this is done by doping the transfer gate differently on the source and drain sides. However, advantageously, the charges may be clocked out of the photodiode to the floating diffusion region while preventing them to "spill-back" to the photodiode by switched application of two different biasing potentials at each respective transfer gate n and p portion.

In further processing steps, as mentioned, the transfer gate contacts, e.g., transfer gate electrodes 76a and 76b, 77a and 77b, 79b, 79c, etc. formed in the embodiments depicted in FIGS. 4, 5, 9, 14, are spaced such that the distance between the electrodes is be too large or the inversion layers will not be connected. Thus, a maximum distance between adjacent transfer gate electrodes may be on the order of about 200 nm or less.

Moreover, the light shield elements implemented in connection with the present invention may comprise a metal material, and may be formed using one of the levels of metal already present in the process, but manufactured to cover the desired area. (i.e., no holes in the metal.) For example, a shield formed out of a typical first metal level or metal 2 level shield may range between 5 μm to 2 μm above the storage diode. Dimensions of the shield are preferably greater than 100 Å. There is no maximum, but larger structures would likely interfere with the image light adjacent to this structure thus, the 100 Å-1 µm is a practical range of light shield element thicknesses according to the invention.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method of forming an active pixel sensor (APS) cell structure comprising the steps of:
providing a substrate of a first conductivity type material;
forming a gate dielectric layer on the substrate;
forming a gate conductor structure on the gate dielectric layer, said gate conductor structure comprising a first doped region of first conductivity type material including an associated first transfer gate electrode and a second doped region of a second conductivity type material including an associated second transfer gate electrode, wherein the first doped region of the first conductivity type material and the second doped region of the second conductivity type material are in direct contact, wherein the gate conductor structure further comprises separate conductors to each of said first and second transfer gate electrodes to apply separate voltage signals to each of said first and second transfer gate electrodes by direct electrical contact to each of the first and second doped regions;
forming a photosensing device formed at or below a substrate surface adjacent said first doped region of said gate conductor structure for collecting charge carriers in response to light incident thereto; and
forming a diffusion region of a second conductivity type material at or below said substrate surface adjacent said second doped region of said gate conductor structure, said gate conductor structure defining a channel region in said substrate for enabling charge transfer between said photosensing device and said diffusion region,
said first and second transfer gate electrodes for receiving said separate voltage signals timed for transferring collected charge carriers from said photosensing device to said diffusion region while preventing spillback of charges to said photosensing device.

2. The method of forming as claimed in claim 1, wherein said gate conductor structure comprises a diode.

3. The method of forming as claimed in claim 1, wherein said first doped region of first conductivity type material and said second doped region of a second conductivity type material of said gate conductor structure are separated by a distance.

4. The method of forming APS cell structure as claimed in claim 1, wherein said gate conductor device is a first gate conductor device and said step of forming said diffusion region of a second conductivity type material is replaced with additional steps comprising:
forming a charge storage device adjacent said first gate conductor structure at or below a substrate surface for storing charge carriers transferred from the photosensing device;
forming a light shield element for preventing incident light from reaching the charge storage device in accordance with a global shutter mode of operation;
forming a second gate conductor structure on a gate dielectric layer, said second gate conductor structure comprising a second doped region of second conductivity type material including an associated second transfer gate electrode; and,
forming a doped diffusion region at or below said substrate surface adjacent said second gate conductor structure for receiving charge carriers collected from said charge storage device as transferred from said photosensing device.

5. The method of forming APS cell structure as claimed in claim 1, wherein said gate conductor device is a first gate conductor device and said step of forming said diffusion region of a second conductivity type material is replaced with additional steps comprising:
forming a second gate conductor structure on said gate dielectric layer adjacent to and separated by a distance from the first gate conductor structure, the second gate conductor structure comprising a doped region of second conductivity type material including an associated second transfer gate electrode; and,
forming a doped diffusion region formed at or below the substrate surface adjacent the second gate conductor structure for receiving charge carriers collected from said photosensing device; and,
forming a light shield element for preventing incident light from reaching the second doped region of a second conductivity type material of said first gate conductor structure in accordance with a global shutter mode of operation.

6. A method of operating an active pixel sensor (APS) cell structure comprising:
providing an active pixel sensor (APS) cell structure comprising:
a substrate of a first conductivity type material;
a gate dielectric layer formed on the substrate;
a gate conductor structure formed on the gate dielectric layer, said gate conductor structure comprising a first doped region of first conductivity type material including an associated first transfer gate electrode and a second doped region of a second conductivity type material including an associated second transfer gate electrode, wherein the first doped region of the first conductivity type material and the second doped region of the second conductivity type material are in direct contact, wherein the gate conductor structure further comprises separate conductors to each of said first and second transfer gate electrodes to apply separate voltage signals to each of said first and second transfer gate electrodes by direct electrical contact to each of the first and second doped regions;
a photosensing device formed at or below a substrate surface adjacent said first doped region of said gate conductor structure for collecting charge carriers in response to light incident thereto; and
a diffusion region of a second conductivity type material formed at or below said substrate surface adjacent said second doped region of said gate conductor structure, said gate conductor layer defining a channel region in said substrate enabling charge transfer between said photosensing device and said diffusion region, and
wherein subsequent to performing charge carrier collection in response to light incident at said photosensing device, applying said separate voltage signals to said first and second transfer gate electrodes timed for transferring collected charge carriers from said photsensing device to said diffusion region while preventing spillback of charges to said photosensing device.

7. The method of operating an active pixel sensor (APS) cell structure as claimed in claim 6, wherein said gate conductor structure comprises a diode.

8. The method of operating an active pixel sensor (APS) cell structure as in claim 6, wherein said first doped region of first conductivity type material and said second doped region of a second conductivity type material are separated by a distance.

9. The method of operating an active pixel sensor (APS) cell structure as claimed in claim 6, wherein said signals applied to said first and second transfer gate electrodes are respectively applied in timed succession for preventing said spillback of charges.

10. The method of operating an active pixel sensor (APS) cell structure as claimed in claim 6, wherein said gate conductor structure is a first gate conductor structure comprising a diodic transfer gate having said first doped region of first conductivity type material and said second doped region of a second conductivity type material, and said diffusion region of second conductivity type material is replaced with:
 a charge storage device formed adjacent said first gate conductor structure at or below a substrate surface for storing charge carriers transferred from the photosensing device;
 a light shield element for preventing incident light from reaching the charge storage device in accordance with a global shutter mode of operation;
 a second gate conductor structure formed on a gate dielectric layer, said second gate conductor structure comprising a second doped region of second conductivity type material including an associated second transfer gate electrode; and,
 a second doped diffusion region formed at or below said substrate surface adjacent said second gate conductor structure for receiving charge carriers collected from said charge storage device as transferred from said photosensing device;
said method including additional steps of:
performing charge carrier collection in response to light incident at said photosensing device; and
after performing said charge carrier collection, applying successive timing signals to said respective first and second gate conductor transfer gate electrodes for forcing collected charge carriers from said photosensing device to said charge storage device while preventing spillback of charges to said photosensing devices; and,
subsequently applying a further voltage to said additional second gate conductor structure for transferring collected charge carriers from said charge storage device to said second doped diffusion region.

* * * * *